US012707559B2

(12) United States Patent
Kwon et al.

(10) Patent No.: US 12,707,559 B2
(45) Date of Patent: Aug. 11, 2026

(54) CIRCUIT BOARD

(71) Applicant: LG INNOTEK CO., LTD., Seoul (KR)

(72) Inventors: Myung Jae Kwon, Seoul (KR); Dong Sun Kim, Seoul (KR); Sang Hyuck Nam, Seoul (KR); Sung Wuk Ryu, Seoul (KR); Chang Woo Yoo, Seoul (KR); Ju Hyun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 439 days.

(21) Appl. No.: 18/037,825

(22) PCT Filed: Nov. 19, 2021

(86) PCT No.: PCT/KR2021/017081
§ 371 (c)(1),
(2) Date: May 19, 2023

(87) PCT Pub. No.: WO2022/108386
PCT Pub. Date: May 27, 2022

(65) Prior Publication Data

US 2023/0413425 A1 Dec. 21, 2023

(30) Foreign Application Priority Data

Nov. 20, 2020 (KR) ........................ 10-2020-0156476
Dec. 7, 2020 (KR) ........................ 10-2020-0169269

(51) Int. Cl.
*H05K 3/42* (2006.01)
*H05K 1/02* (2006.01)
(Continued)

(52) U.S. Cl.
CPC ......... *H05K 1/0272* (2013.01); *H05K 1/0271* (2013.01); *H05K 1/113* (2013.01);
(Continued)

(58) Field of Classification Search
CPC .... H05K 1/0272; H05K 1/0271; H05K 1/113; H05K 3/4644
See application file for complete search history.

(56) References Cited

U.S. PATENT DOCUMENTS 11,348,723 B2 * 5/2022 Moon ................... H01F 27/292
2011/0089138 A1 * 4/2011 Ko ......................... H05K 3/107 216/17
(Continued)

FOREIGN PATENT DOCUMENTS

JP 2000-277910 A 10/2000
JP 2008-172151 A 7/2008
(Continued)

*Primary Examiner* — Timothy J Thompson
*Assistant Examiner* — Aditya Sharma
(74) *Attorney, Agent, or Firm* — Birch, Stewart, Kolasch & Birch, LLP

(57) ABSTRACT

A circuit board according to an embodiment includes a first insulating layer including a first region and a second region; and a first circuit pattern layer disposed on the first insulating layer; wherein the first circuit pattern layer includes a first electrode disposed on the first region of the first insulating layer and including a first opening, and wherein the first opening pass through upper and lower surfaces of the first electrode.

16 Claims, 14 Drawing Sheets

(51) Int. Cl.
*H05K 1/11* (2006.01)
*H05K 3/40* (2006.01)

(52) U.S. Cl.
CPC . *H05K 3/4038* (2013.01); *H05K 2201/09381* (2013.01); *H05K 2201/09409* (2013.01); *H05K 2201/09781* (2013.01)

(56) References Cited

U.S. PATENT DOCUMENTS

| | | | | |
|---|---|---|---|---|
| 2014/0251659 | A1* | 9/2014 | Asano | H05K 1/09 174/268 |
| 2016/0284636 | A1* | 9/2016 | Matsuwaka | H01L 23/49827 |
| 2017/0208692 | A1* | 7/2017 | Ahn | H05K 1/115 |
| 2020/0365418 | A1* | 11/2020 | Sawada | H05K 3/4007 |
| 2022/0165649 | A1* | 5/2022 | Choi | H01L 23/49838 |
| 2022/0272238 | A1* | 8/2022 | Jang | G02B 7/1805 |
| 2022/0377902 | A1* | 11/2022 | Shin | H05K 1/111 |

FOREIGN PATENT DOCUMENTS

| | | | |
|---|---|---|---|
| KR | 10-0643930 | B1 | 11/2006 |
| KR | 10-0646606 | B1 | 11/2006 |
| KR | 10-2008-0092996 | A | 10/2008 |
| KR | 10-2014-0017699 | A | 2/2014 |
| KR | 10-2016-0081272 | A | 7/2016 |
| KR | 10-2016-0138753 | A | 12/2016 |
| KR | 10-1893839 | B1 | 8/2018 |
| KR | 10-2019-0118438 | A | 10/2019 |

* cited by examiner

【FIG. 1】
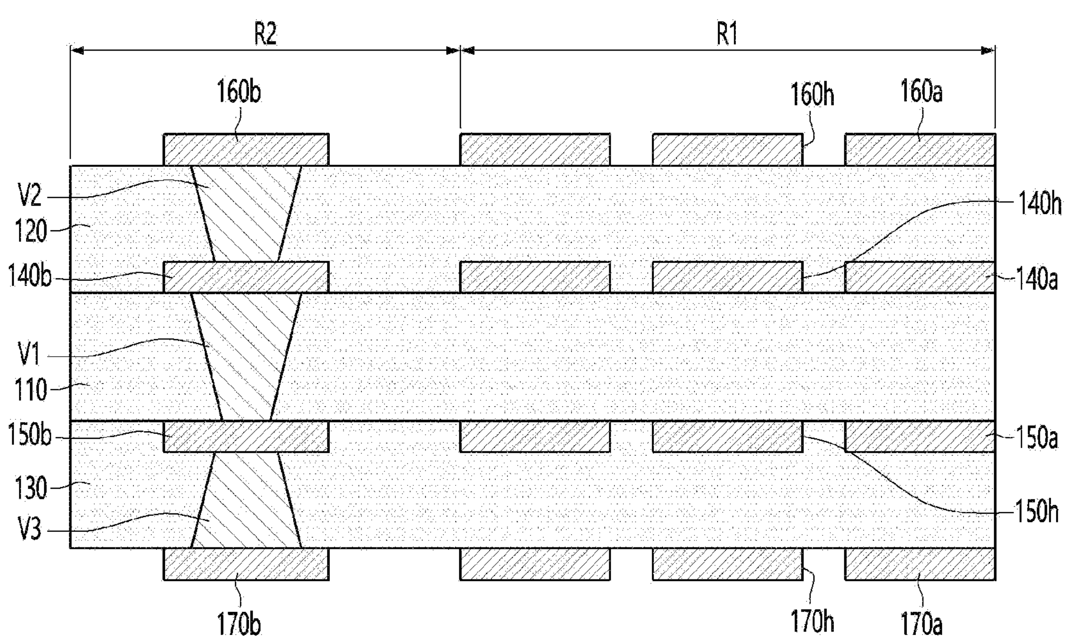

【FIG. 2】
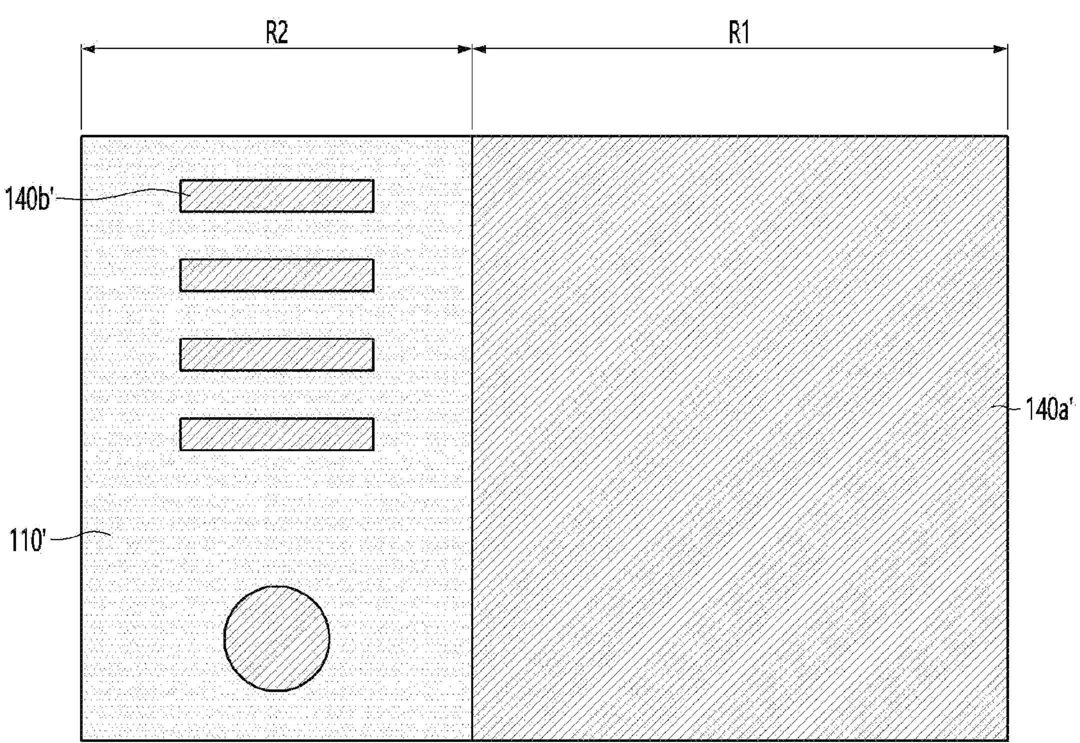

【FIG. 3】
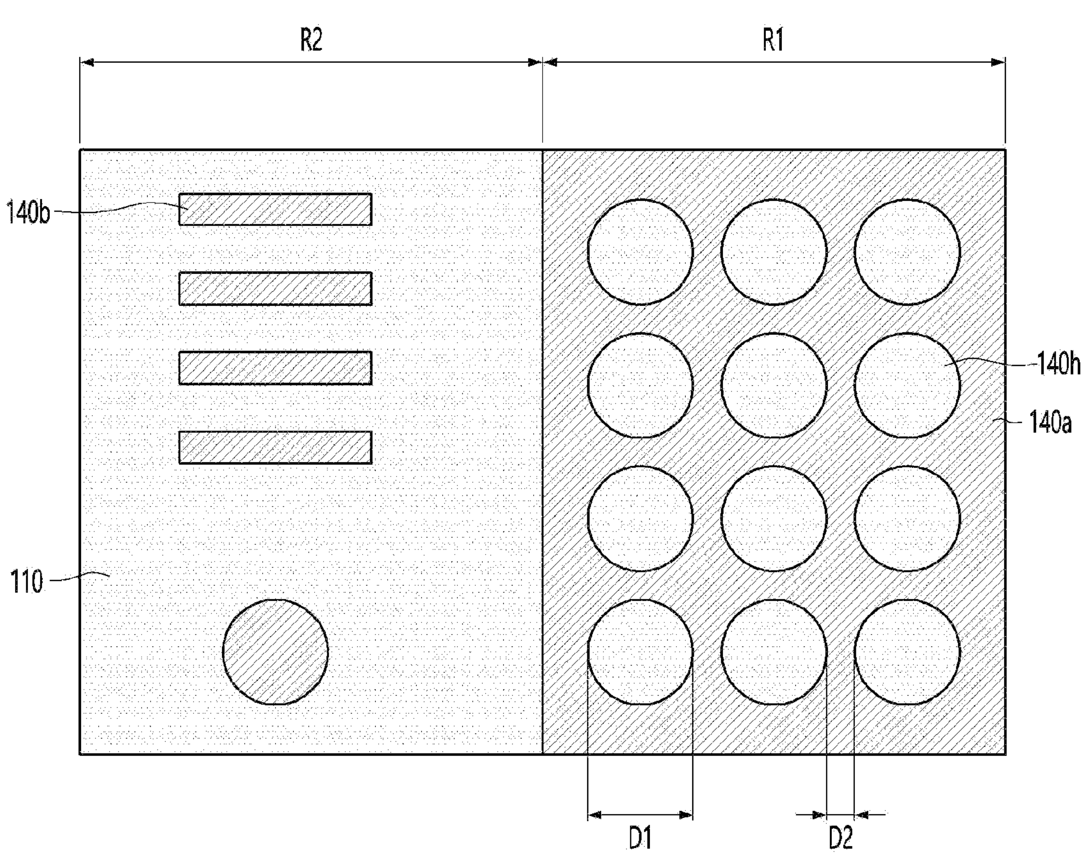

【FIG. 4】
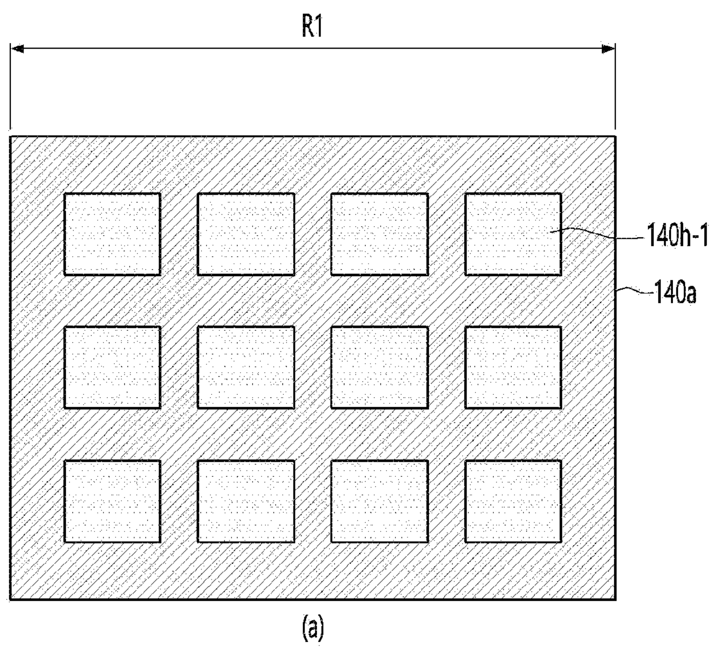
(a)
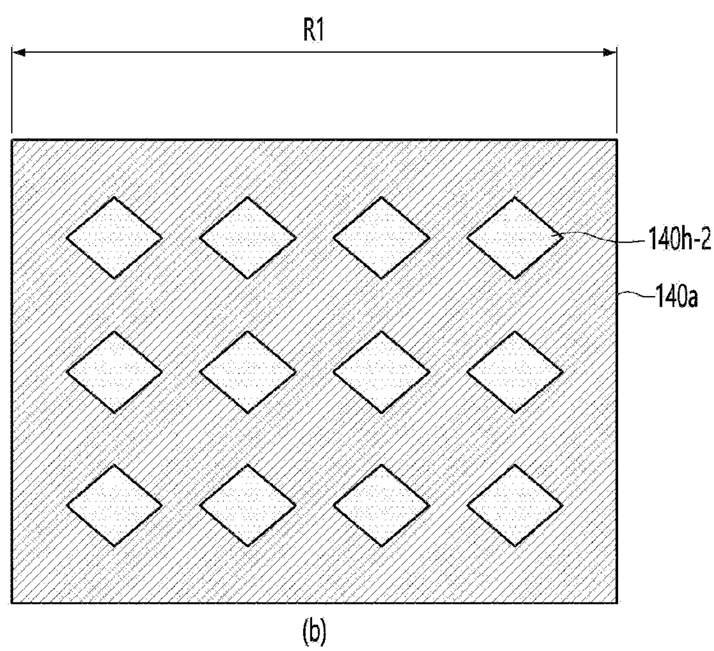
(b)

【FIG. 5】
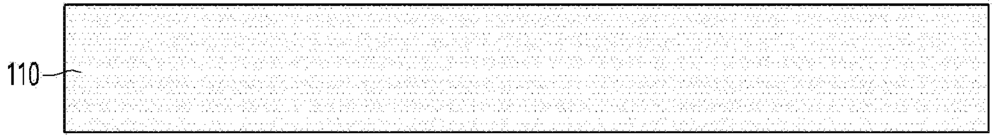
【FIG. 6】
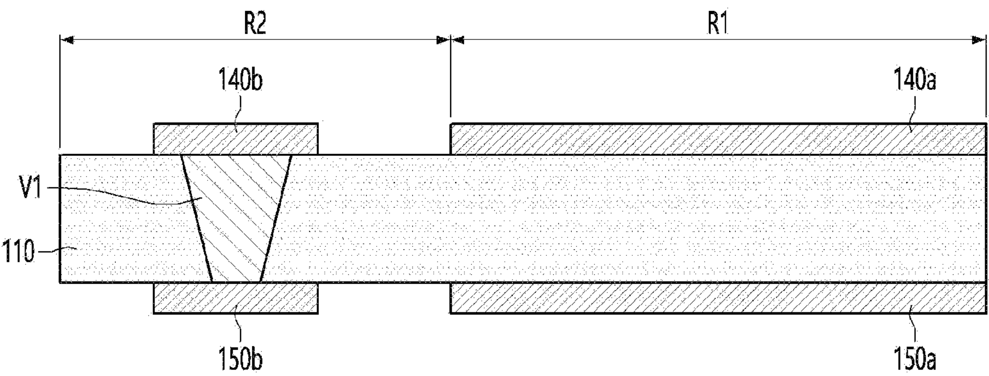
【FIG. 7】
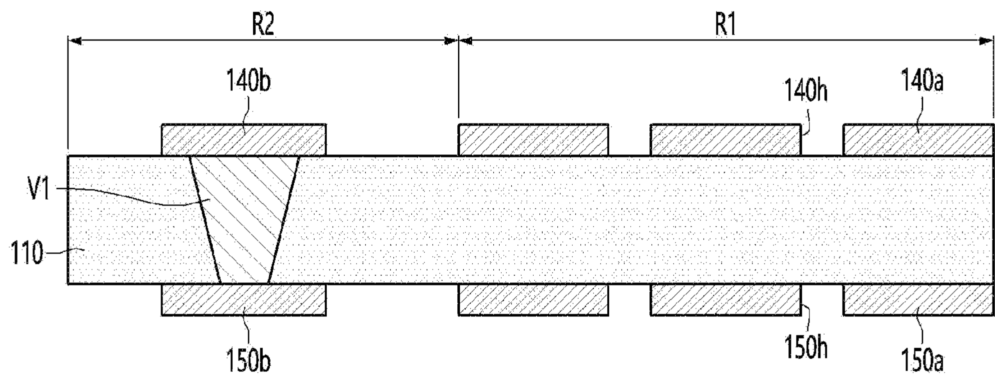

【FIG. 8】
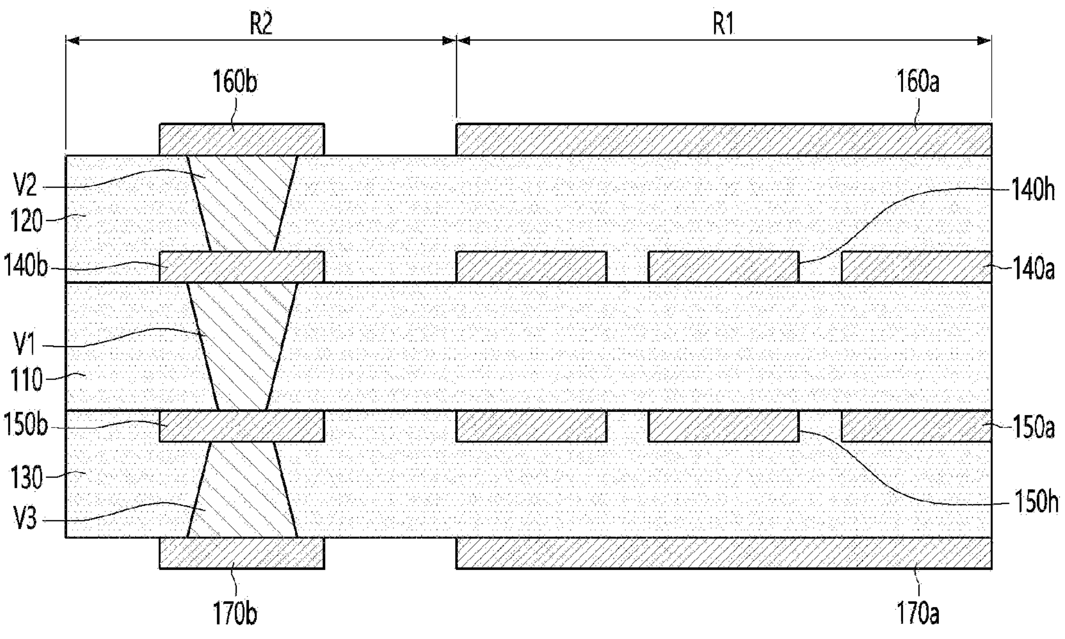
【FIG. 9】
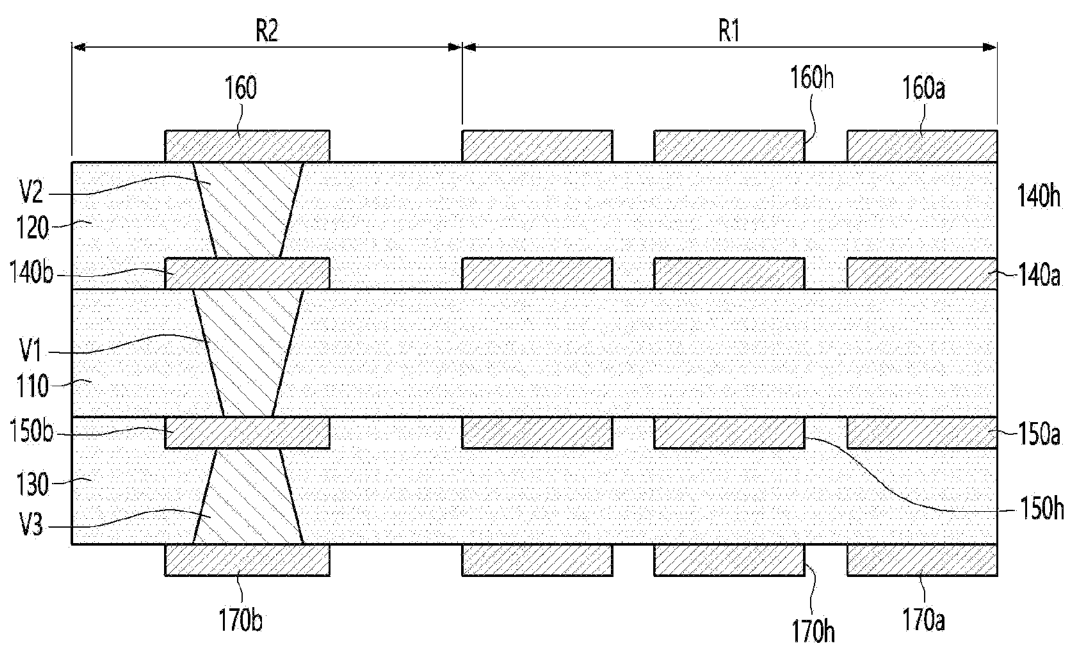

【FIG. 10】
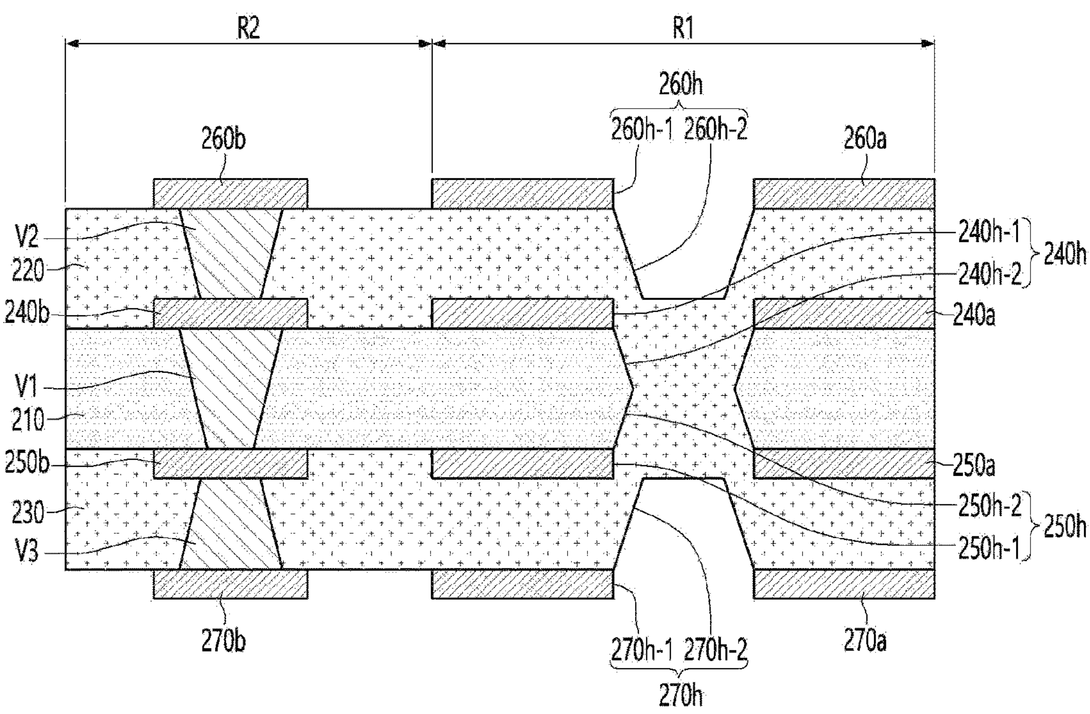
【FIG. 11】
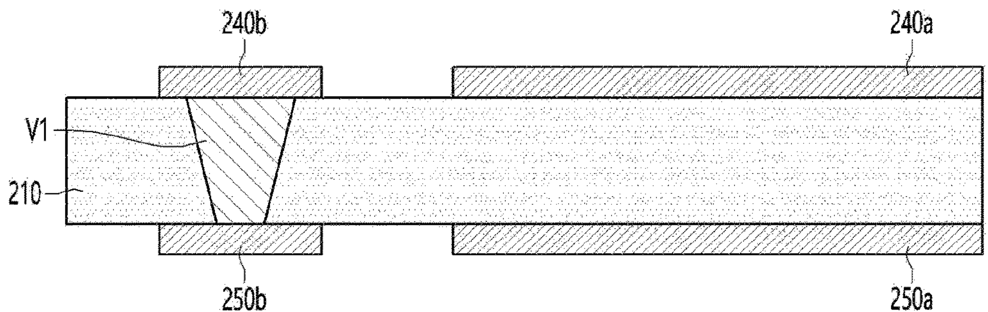

【FIG. 12】
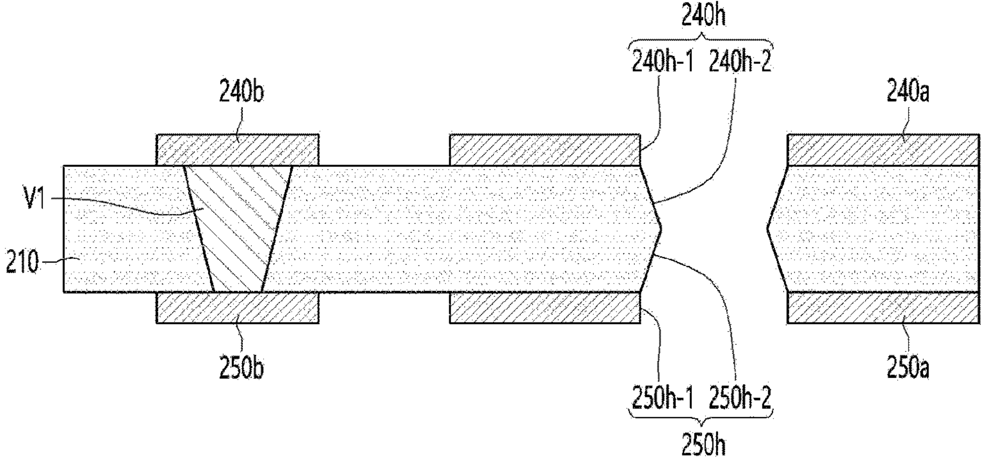
【FIG. 13】
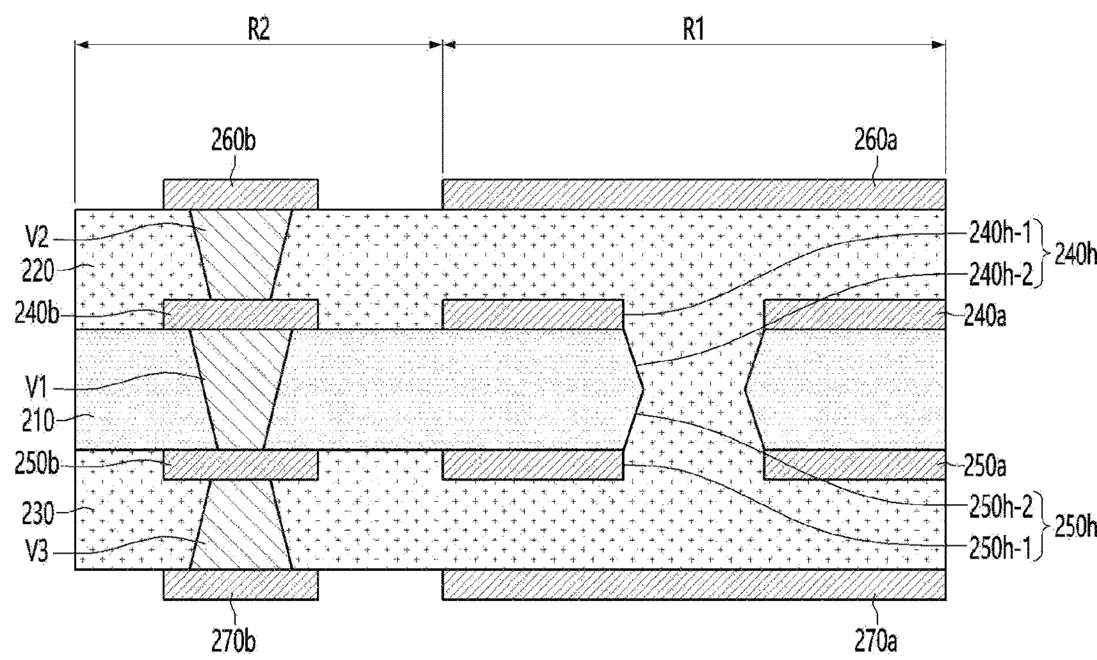

【FIG. 14】
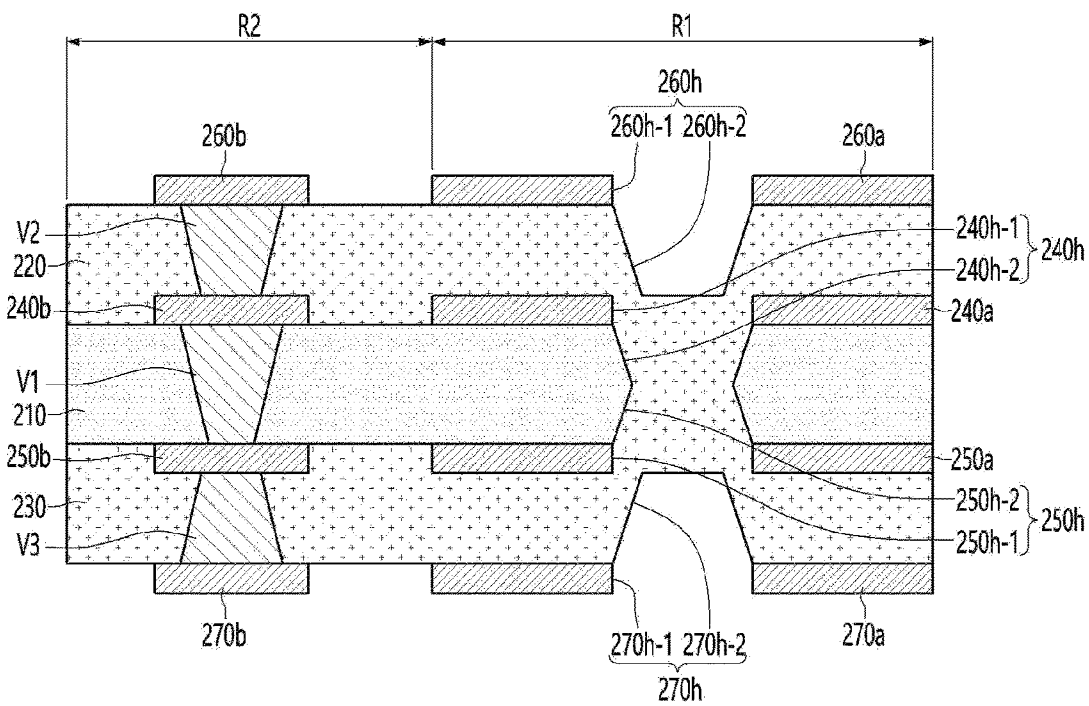
【FIG. 15】
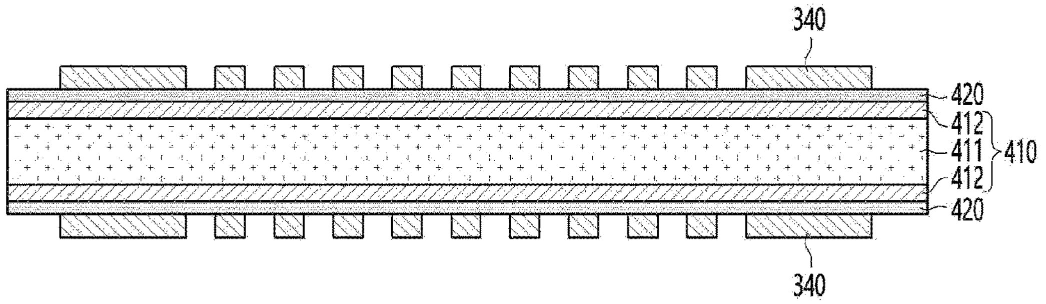

【FIG. 16】
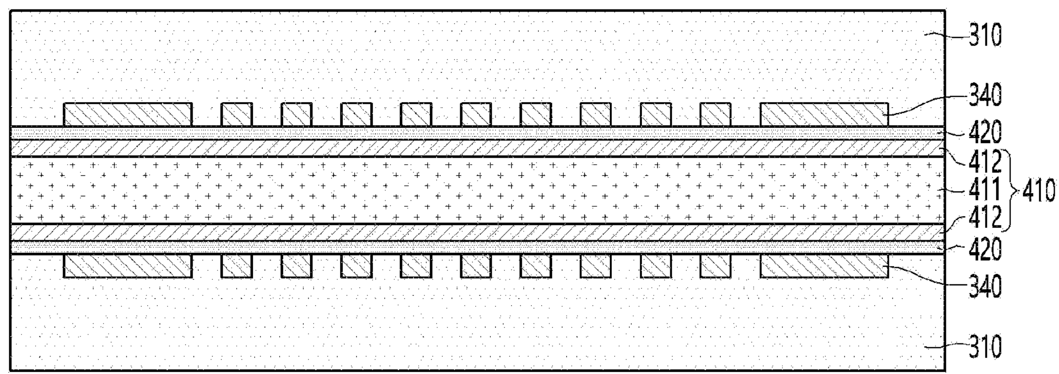
【FIG. 17】
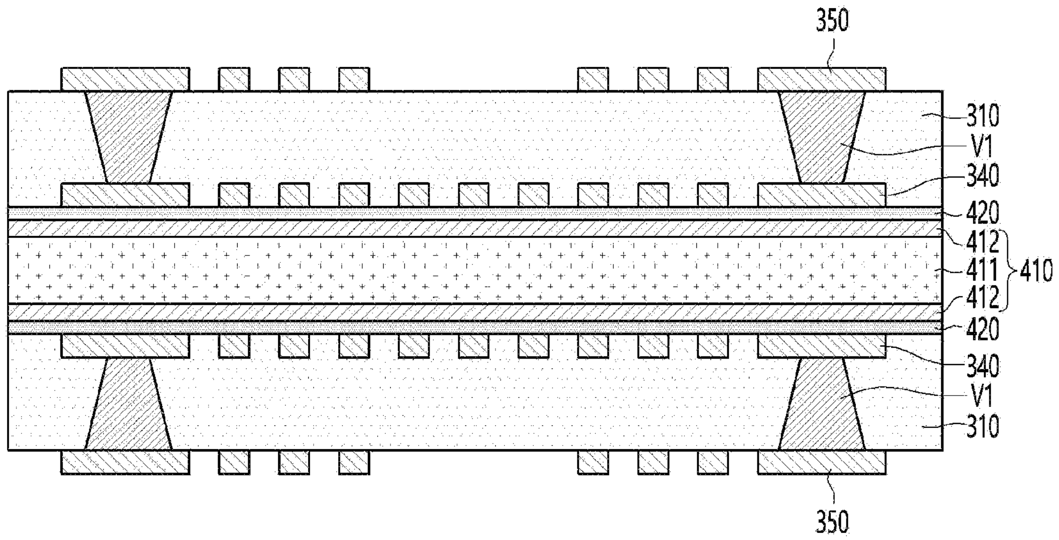

【FIG. 18】
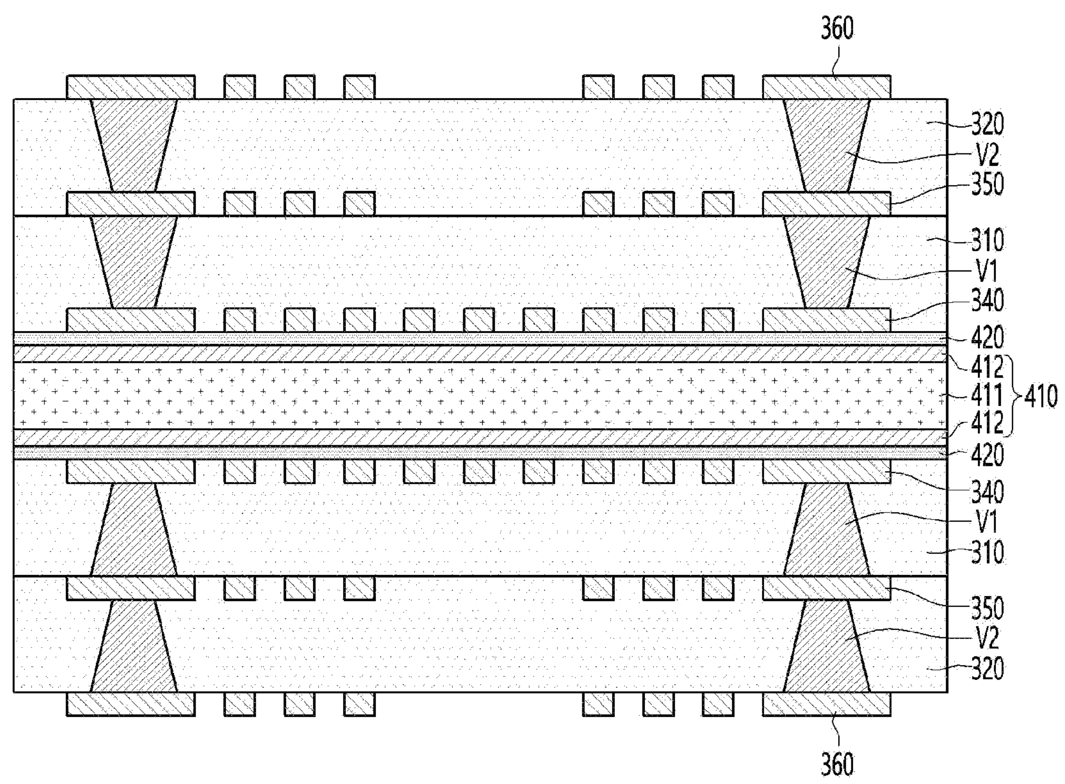

【FIG. 19】
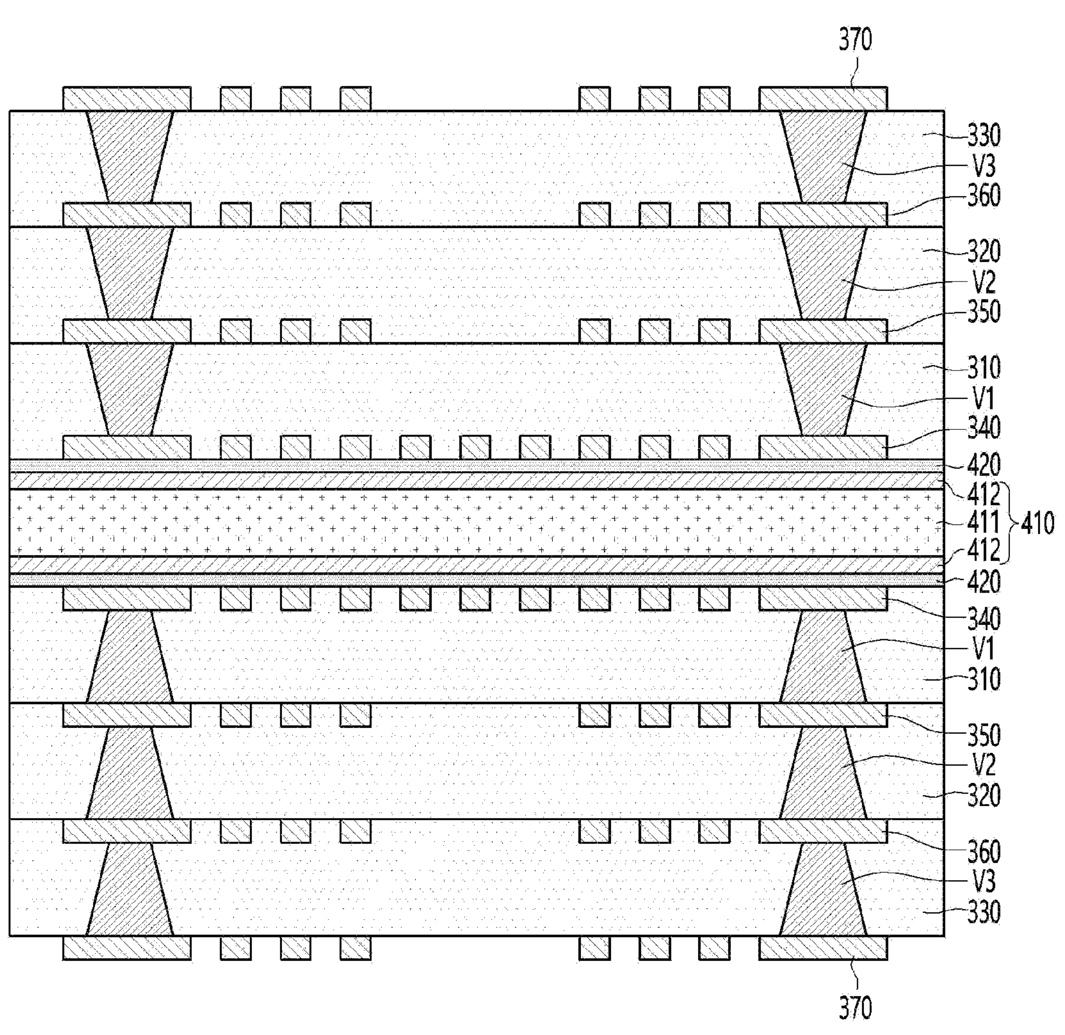

【FIG. 20】
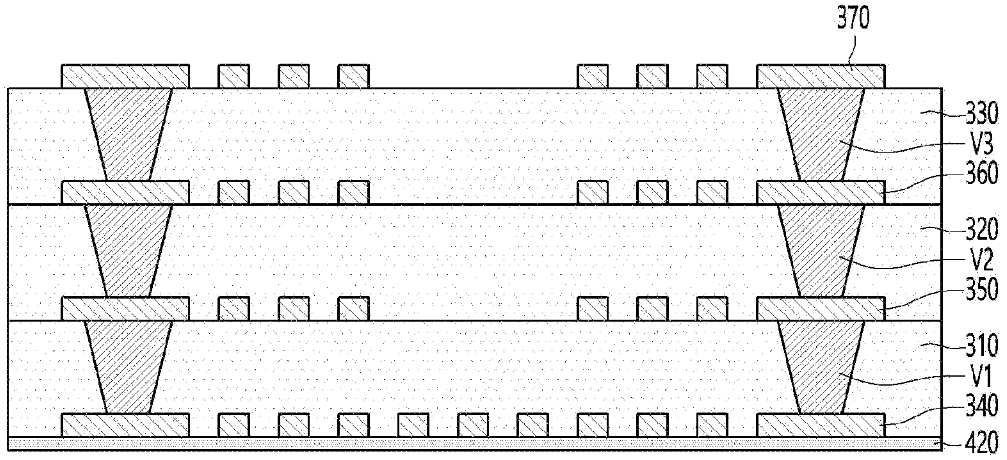
【FIG. 21】
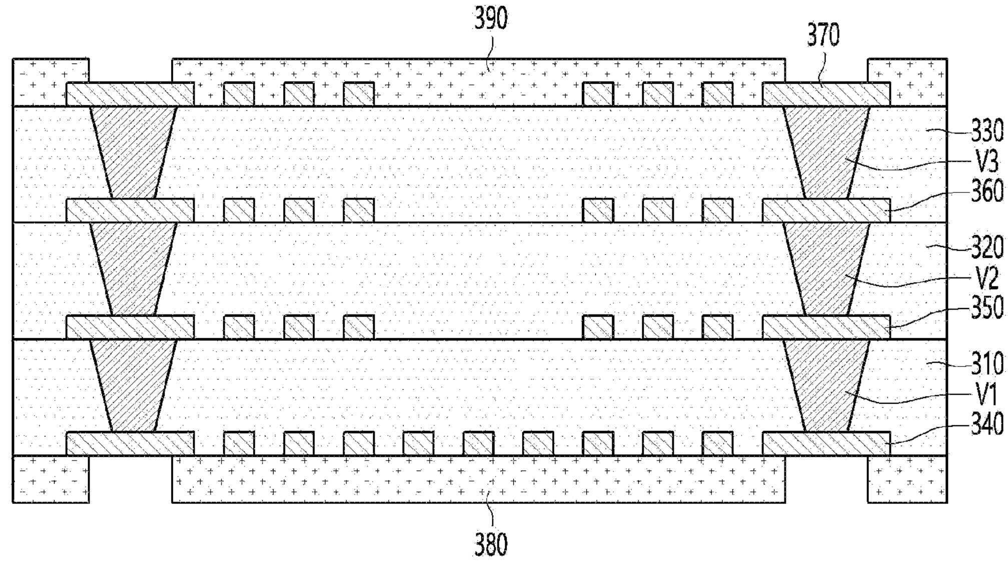

【FIG. 22】
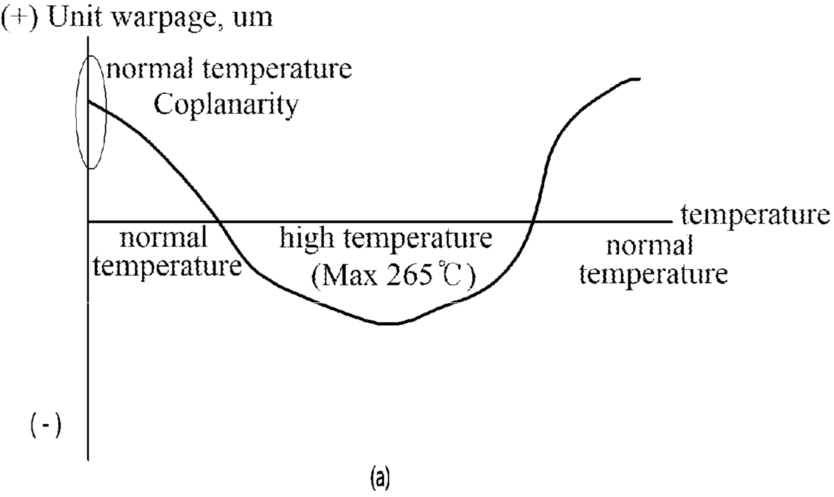
(a)
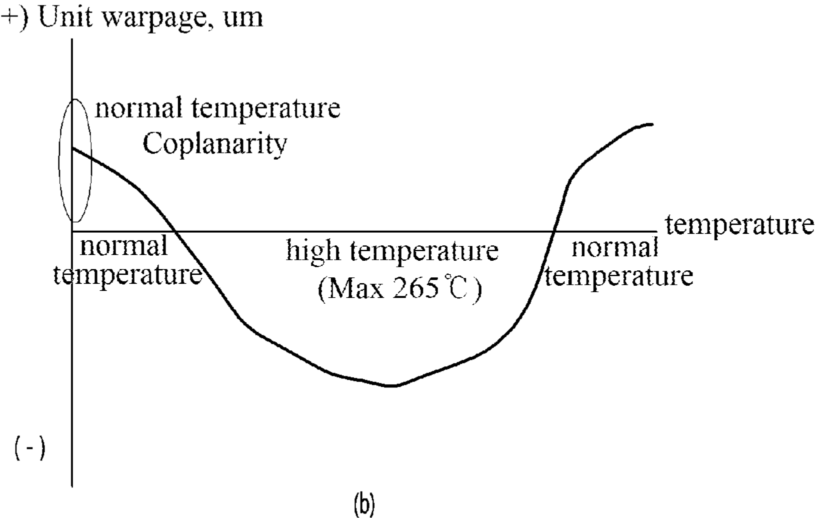
(b)

CIRCUIT BOARD

CROSS REFERENCE TO RELATED APPLICATIONS

This application is the National Phase of PCT International Application No. PCT/KR2021/017081, filed on Nov. 19, 2021, which claims priority under 35 U.S.C. § 119(a) to Patent Application Nos. 10-2020-0156476, filed in the Republic of Korea on Nov. 20, 2020, and 10-2020-0169269, filed in the Republic of Korea on Dec. 7, 2020, all of which are hereby expressly incorporated by reference into the present application.

TECHNICAL FIELD

An embodiment relates to a circuit board.

BACKGROUND ART

An electronic component is being miniaturized, lightweight, and integrated, and accordingly, a line width of circuit is miniaturized. In particular, a design rule of a semiconductor chip are being integrated on a nanometer scale, and accordingly, a circuit line width of a package substrate or a circuit board on which semiconductor chips are mounted is miniaturized to several micrometers or less.

Various methods have been proposed in order to increase the degree of circuit integration of the printed circuit board, that is, to reduce the circuit line width. For the purpose of preventing loss of the circuit line width in an etching process for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for making the circuit pitch fine.

On the other hand, the circuit board as described above is forming a metal layer through electroless chemical copper plating for miniaturization. The metal layer formed through the electroless chemical copper plating may be used to form a circuit pattern layer.

However, in a conventional circuit board as described above, residual basic gas remains at the interface between the insulating layer and the metal layer, which may affect reliability. For example, the conventional circuit board is vulnerable to thermal stress due to the residual basic gas, and bonding failure in which a metal layer is detached from an insulating layer may occur.

DISCLOSURE

Technical Problem

An embodiment provides a circuit board having a structure capable of removing basic gas remaining between the insulating layer and the circuit pattern layer.

In addition, the embodiment provides a circuit board having a structure capable of improving bonding strength between an insulating layer and a circuit pattern layer.

In addition, the embodiment provides a circuit board capable of improving the plating deviation of the circuit pattern layer.

In addition, the embodiment provides a circuit board capable of improving a warpage property.

In addition, the embodiment provides a circuit board capable of minimizing stress generated during lamination of a multilayer structure.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes a first insulating layer including a first region and a second region; and a first circuit pattern layer disposed on the first insulating layer; wherein the first circuit pattern layer includes a first electrode disposed on the first region of the first insulating layer and including a first opening, and wherein the first opening pass through upper and lower surfaces of the first electrode.

In addition, first region includes a dummy region, and the first electrode includes a first dummy pattern.

In addition, the first opening vertically overlaps the first electrode, and is provided in a plurality while being spaced apart from each other in a horizontal direction.

In addition, the circuit board further includes a second insulating layer disposed on the first insulating layer; and a second circuit pattern layer disposed on the second insulating layer; and wherein the second insulating layer is disposed on the first insulating layer while filling the first opening of the first electrode.

In addition, the second circuit pattern layer includes a second electrode vertically overlapping the first electrode and including a second opening, and wherein the second opening pass through upper and lower surfaces of the second electrode.

In addition, the plurality of first openings have a diameter in a range of 100 μm to 300 μm.

In addition, a distance between the plurality of first openings adjacent to each other has a range of 25 μm to 50 μm.

In addition, the first opening includes a first portion passing through the first electrode; and a second portion vertically overlapped with the first portion and formed in the first insulating layer.

In addition, the second portion includes at least one of a through hole passing through the first insulating layer and a recess portion non-passing through the first insulating layer.

In addition, the second insulating layer is provided to fill the first portion and the second portion of the first opening.

In addition, the second opening includes a third portion passing through the second electrode; and a fourth portion vertically overlapped with the third portion and formed in the second insulating layer, wherein the circuit board further includes a protective layer disposed on the second insulating layer and filling the third portion and the fourth portion of the second opening.

Advantageous Effects

The embodiment includes a first electrode disposed on a first region R1 of the insulating layer. In addition, the first electrode includes a first opening. For example, the first opening vertically overlaps one first electrode and is provided in a plurality while being spaced apart from each other in a horizontal direction. For example, the first opening may be provided in a dot shape in the first electrode. Accordingly, the embodiment can improve the reliability of the circuit board by removing gas between the insulating layer and the circuit pattern layer. For example, the embodiment may remove gas remaining in the insulating layer, and thus, thermal stress of the insulating layer may be minimized. For example, the embodiment can remove gas remaining in the insulating layer, thereby solving a reliability problem in which the circuit pattern layer is detached from the insulating layer. In addition, the embodiment may allow a plurality of first openings to be included in the first electrode, and accordingly, plating deviation of the circuit pattern layer may be improved by adjusting an area of the first electrode.

In addition, the embodiment can completely remove gas penetrating into the insulating layer, thereby further improving reliability. For example, the first opening of the embodiment includes a first portion formed in the first electrode, and a second portion extending from the first portion and formed in the insulating layer. Accordingly, the embodiment can completely remove even the gas penetrating into the insulating layer, thereby further improving reliability.

In addition, the embodiment can improve the warpage property of the circuit board. Specifically, in the embodiment, a circuit board is manufactured by sequentially laminating a plurality of insulating layers. In this case, the embodiment applies a different curing temperature to each insulating layer in a laminating process of the plurality of insulating layers. For example, a curing temperature may be increased stepwise in an order of lamination. For example, in the embodiment, the curing temperature of an insulating layer laminated first among the plurality of insulating layers is the lowest compared to a curing temperature of the other insulating layers. In addition, in the embodiment, a curing temperature of an insulating layer laminated last among the plurality of insulating layers is the highest compared to a curing temperature of the other insulating layers. Accordingly, the embodiment can improve a warpage property through balance optimization of a laminated curing degree of each insulating layer of a multi-layer substrate.

In addition, the embodiment can minimize the shrinkage that occurs in the assembly process of the circuit board. That is, when the circuit board is separated from a carrier board, the embodiment proceeds with a process of baking the circuit board. In addition, when the baking process proceeds, shrinkage in a reflow process additionally performed on the separated circuit board may be minimized. That is, the circuit board can be used as a package board, and accordingly, a process of reflowing a solder is performed after disposing the solder (not shown) on an outermost circuit pattern layer in an assembly process. In this case, shrinkage of the circuit board may occur in the reflow process, and thus, there is a problem in that warpage property of the circuit board is deteriorated. In contrast, in the embodiment, a baking process is performed on the separated circuit board. In addition, the degree of shrinkage of the circuit board generated in the reflow process can be minimized by the baking process, and thus a reliability problem of the circuit board can be solved.

DESCRIPTION OF DRAWINGS

FIG. 1 is a view illustrating a circuit board according to a first embodiment.

FIG. 2 is a plan view of a partial layer of a circuit board according to a comparative example.

FIG. 3 is a plan view of a partial layer of a circuit board according to an embodiment.

FIG. 4 is a modified example of a shape of an opening formed in a dummy pattern according to an embodiment.

FIGS. 5 to 9 are views illustrating a method of manufacturing a circuit board illustrated in FIG. 1 in order of process.

FIG. 10 is a view illustrating a circuit board according to a second embodiment.

FIGS. 11 to 14 are views illustrating a method of manufacturing a circuit board illustrated in FIG. 10 in order of process.

FIGS. 15 to 21 are views illustrating a method of manufacturing a circuit board according to a third embodiment in order of process.

FIG. 22 is a view illustrating shrinkage properties in an assembly process in the third embodiment and the comparative example.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

FIG. 1 is a view illustrating a circuit board according to a first embodiment, FIG. 2 is a plan view of a partial layer of a circuit board according to a comparative example, and FIG. 3 is a plan view of a partial layer of a circuit board according to an embodiment.

Referring to FIGS. 1 to 3, the circuit board includes a first insulating layer 110, a second insulating layer 120, a third insulating layer 130, a circuit pattern layer 140*a*, 140*b*, 150*a*, 150*b*, 160*a*, 160*b*, 170*a* and 170*b* and a via V1, V2 and V3.

The circuit board expresses electric wiring connecting circuit components in a wiring diagram based on a circuit design, and may reproduce an electric conductor on an insulating layer. In addition, such a circuit board may mount electrical components and form wiring connecting them in a circuit manner, and may can mechanically fix parts other than their electrical connection function.

Such a circuit board includes a plurality of insulating layers 110, 120 and 130. The plurality of insulating layers 110, 120, and 130 may be a support substrate of a circuit board on which a single circuit pattern is formed, alternatively, it may refer to an insulating region in which one circuit pattern of a circuit board having a plurality of laminated structures is formed.

The circuit board may include the first insulating layer 110. In addition, the circuit board may include a second insulating layer 120 disposed on the first insulating layer 110. In addition, the circuit board may include a third insulating layer 130 disposed under the first insulating layer 110. Here, the circuit board is illustrated as having a structure including three insulating layers on the drawing, but is not limited thereto. For example, the circuit board may have a structure including less than three insulating layers, or may have a structure including more than three insulating layers. Hereinafter, the circuit board will be described as having a structure including three insulating layers for convenience of explanation.

At least one of the first insulating layer 110, the second insulating layer 120, and the third insulating layer 130 may be rigid or flexible. For example, at least one of the first insulating layer 110, the second insulating layer 120, and the third insulating layer 130 may include glass or plastic. Specifically, at least one of the first insulating layer 110, the second insulating layer 120, and the third insulating layer 130 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, at least one of the first insulating layer 110, the second insulating layer 120, and the third insulating layer 130 may include an optically isotropic film. As an example, at least one of the first insulating layer 110, the second insulating layer 120, and the third insulating layer 130 may include cyclic olefin copolymer (COC), cyclic olefin polymer (COP), optically isotropic PC, optically isotropic polymethylmethacrylate (PMMA), or the like.

In addition, at least one of the first insulating layer 110, the second insulating layer 120, and the third insulating layer 130 may be partially bent while having a curved surface. That is, at least one of the first insulating layer 110, the second insulating layer 120, and the third insulating layer 130 may partially have a plane and may partially be bent while having a curved surface. Specifically, an end portion of at least one of the first insulating layer 110, the second insulating layer 120, and the third insulating layer 130 may be bent while having a curved surface, or bent or crooked while having a surface with a random curvature.

In addition, at least one of the first insulating layer 110, the second insulating layer 120, and the third insulating layer 130 may be a flexible substrate having flexibility. In addition, at least one of the first insulating layer 110, the second insulating layer 120, and the third insulating layer 130 may be a curved or bent substrate. In this case, at least one of the first insulating layer 110, the second insulating layer 120, and the third insulating layer 130 expresses electric wiring connecting circuit components in a wiring diagram based on the circuit design, and can reproduce an electric conductor on an insulator. In addition, at least one of the first insulating layer 110, the second insulating layer 120, and the third insulating layer 130 may mount electrical components and form wires connecting them in a circuit manner, and may mechanically fix components other than the electrical connection function of the components.

Meanwhile, the circuit board of the embodiment may include a first region R1 and a second region R2. For example, the first insulating layer 110, the second insulating layer 120, and the third insulating layer 130 may include a first region R1 and a second region R2, respectively.

The first region R1 may be a dummy region including a dummy pattern. The second region R2 may be a region other than the first region R1. In general, a circuit board includes a dummy region corresponding to the first region R1, and improves reliability of the board by forming a dummy pattern in the dummy region. In this case, in the circuit board according to the first embodiment, the dummy pattern covers a dummy region corresponding to the first region R1. In this case, the dummy pattern formed in the first region R1 in the first embodiment may include a plurality of openings. For example, one dummy pattern formed in the first region R1 may include a plurality of openings spaced apart from each other in a horizontal direction. For example, the dummy pattern may include a dot-shaped opening. The dummy pattern including the plurality of openings may function to degas gas remaining in the first insulating layer 110, the second insulating layer 120, and the third insulating layer 130.

Specifically, a circuit pattern layer may be formed on surfaces of the first insulating layer 110, the second insulating layer 120, and the third insulating layer 130.

For example, a first circuit pattern layer may be formed on an upper surface of the first insulating layer 110. In addition, a second circuit pattern layer may be formed on a lower surface of the first insulating layer 110. In addition, a third circuit pattern layer may be formed on an upper surface of the second insulating layer 120. In addition, a fourth circuit pattern layer may be formed on a lower surface of the third insulating layer 130. These circuit pattern layers may include a dummy pattern and an effective pattern. For example, the circuit pattern layer may include a dummy pattern formed in the first region R1 of each insulating layer and an effective pattern formed in the second region R2.

Meanwhile, a general dummy pattern is formed in the dummy region of the insulating layer. For example, the dummy pattern includes a plurality of patterns spaced apart from each other on the dummy region or includes one pattern entirely covering the dummy region. Accordingly, there is a problem in that gas remains in a region where the dummy pattern is disposed in a general structure of a circuit board. Accordingly, the embodiment allows the dummy pattern to include a plurality of openings, and uses the plurality of openings as degassing holes.

Specifically, the first circuit pattern layer may include a first dummy pattern 140*a* disposed in the first region R1 of the upper surface of the first insulating layer 110 and a first effective pattern 140*b* disposed in the second region R2. The first dummy pattern 140*a* may be referred to as a first electrode of the first circuit pattern layer.

In addition, the second circuit pattern layer may include a second dummy pattern 150*a* disposed in the first region R1 of the lower surface of the first insulating layer 110 and a second effective pattern 150*b* disposed in the second region R2. The second dummy pattern 150*a* may be referred to as a second electrode of the second circuit pattern layer.

In addition, the third circuit pattern layer may include a third dummy pattern 160*a* disposed in the first region R1 of the upper surface of the second insulating layer 120 and a third effective pattern 160*b* disposed in the second region R2. The third dummy pattern 160*a* may be referred to as a third electrode of the third circuit pattern layer.

In addition, the fourth circuit pattern layer may include a fourth dummy pattern 170*a* disposed in the first region R1 of the lower surface of the third insulating layer 130 and a fourth effective pattern 170*b* disposed in the second region R2. The fourth dummy pattern 170*a* may be referred to as a fourth electrode of the fourth circuit pattern layer.

The first to fourth circuit pattern layers may be formed of a metal material having high electrical conductivity. To this end, the first to fourth circuit pattern layers may be formed of at least one metal material selected from gold (Au), silver (Ag), platinum (Pt), titanium (Ti), tin (Sn), copper (Cu), and zinc (Zn). In addition, the first to fourth circuit pattern layers may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the first to fourth circuit pattern layers may be formed of copper (Cu) having high electrical conductivity and a relatively inexpensive price.

The first to fourth circuit pattern layers may be formed by an additive process, a subtractive process, a modified semi additive process (MSAP), and a semi additive process (SAP) process, which are typical circuit board manufacturing processes and a detailed description thereof will be omitted here.

Meanwhile, the circuit board includes vias V1, V2, and V3. The vias V1, V2, and V3 may be formed passing through at least one of the first insulating layer 110, the second insulating layer 120, and the third insulating layer 130. The vias V1, V2, and V3 may electrically connect circuit pattern layers disposed on different layers.

For example, a first via V1 may be formed in the first insulating layer 110. The first via V1 may electrically connect a first circuit pattern layer disposed on the upper surface of the first insulating layer 110 and a second circuit pattern layer disposed on the lower surface of the first insulating layer 110.

For example, a second via V2 may be formed in the second insulating layer 120. The second via V2 may electrically connect the first circuit pattern layer disposed on the upper surface of the first insulating layer 110 and the third circuit pattern layer disposed on the upper surface of the second insulating layer 120.

For example, a third via V3 may be formed in the third insulating layer 130. The third via V3 may electrically connect a second circuit pattern layer disposed on the lower surface of the first insulating layer 110 and a fourth circuit pattern layer disposed on the lower surface of the third insulating layer 130.

Meanwhile, the vias V1, V2, and V3 may be formed by filling a through hole (not shown) passing through at least one of the plurality of insulating layers with a conductive material.

The through hole may be formed by any one of mechanical, laser, and chemical processing. When the through hole is formed by mechanical processing, it may be formed using methods such as milling, drilling, and routing. When the through hole is formed by laser processing, it may be formed using a UV or $CO_2$ laser method. When the through hole is formed by chemical processing, it can be formed using chemicals containing amino silane, ketones, etc. Accordingly, at least one insulating layer among the plurality of insulating layers may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least and has a wide range of possible thicknesses.

As the laser processing drill, it is preferable to use a YAG (Yttrium Aluminum Garnet) laser, a $CO_2$ laser, or an ultraviolet (UV) laser. YAG laser is a laser that can process both copper foil layers and insulating layers, and $CO_2$ laser is a laser that can process only insulating layers.

When the through hole is formed, the vias V1, V2 and V3 may be formed by filling the inside of the through hole with a conductive material. The metal material forming the vias V1, V2 and V3 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting and dispensing.

Meanwhile, each of the first to fourth circuit pattern layers as described above may have a plurality of layer structures. For example, each of the first to fourth circuit pattern layers may include a seed layer and an electrolytic plating layer disposed on the seed layer. In addition, the seed layer may include at least one of a copper foil layer and a chemical copper plating layer, but is not limited thereto.

Meanwhile, a dummy pattern formed in the first region R1 among each circuit pattern layer of the embodiment may include an opening. The opening may be a hole exposing a surface of the insulating layer.

Specifically, a first dummy pattern 140*a* may include a plurality of first openings 140*h* spaced apart from each other. The plurality of first openings 140*h* may vertically overlap an upper surface of the first insulating layer 110.

That is, the plurality of first openings 140*h* may be formed passing through upper and lower surfaces of the first dummy pattern 140*a*. The plurality of first openings 140*h* overlap the same dummy pattern in a vertical direction and may be spaced apart from each other in a horizontal direction. For example, the plurality of first openings 140*h* may have a dot shape.

Accordingly, the upper surface of the first insulating layer 110 vertically overlapping the plurality of first openings 140*h* may not contact the first dummy pattern 140*a* in the state in which the first dummy pattern 140*a* is formed. Gas remaining in the first insulating layer 110 may be degassed through the first opening 140*h*. Accordingly, the embodiment can improve reliability by relieving thermal stress by degassing the gas remaining in the first insulating layer 110.

That is, referring to FIG. 2, a dummy pattern 140*a*' of a comparative example is formed to entirely cover a first region R1 of a first insulating layer 110'. In this case, when the dummy pattern 140*a*' is formed to entirely cover the first region R1 of the first insulating layer 110', gas may remain in the first insulating layer 110', and thus reliability may deteriorate.

Unlike this, the embodiment allows the first dummy pattern 140*a* to have a plurality of dot-shaped first openings 140*h* vertically overlapping the upper surface of the first region R1 of the first insulating layer 110. Accordingly, the embodiment may allow the gas remaining in the first insulating layer 110 to be degassed through a plurality of first openings 140*h* formed in the first dummy pattern 140*a*, thereby solving the reliability problem.

Meanwhile, referring to FIG. 3, a plurality of first openings 140*h* may be provided. That is, the first dummy pattern 140*a* may include a plurality of first openings 140*h* spaced apart from each other by a predetermined distance. That is, the plurality of first openings 140*h* may be formed in a dot shape on the first dummy pattern 140*a*.

Each of the plurality of first openings 140*h* may have a first diameter D1. For example, the first diameter D1 may have a range of 100 μm to 300 μm. When the first diameter D1 of the first opening 140*h* is smaller than 100 μm, gas remaining in the first insulating layer 110 may not be normally degassed. When the first diameter D1 of the first opening 140*h* is greater than 300 μm, an area occupied by the first dummy pattern 140*a* is reduced compared to an total area of the first region R1, and thus overall warpage property of the circuit board may be deteriorated.

Meanwhile, the plurality of first openings 140*h* may be spaced apart from each other by a first distance D2. For example, the first distance D2 may be greater than 25 μm to 50 μm. When the first distance D2 is smaller than 25 μm, a problem in that at least two first openings adjacent to each other among the plurality of first openings 140*h* contact each other may occur. For example, when the first distance D2 is less than 25 μm, an aperture ratio of the first dummy pattern 140*a* by the first opening 140*h* may be too great, and accordingly, the normal function of the first dummy pattern 140*a* may not be performed. For example, when the first distance D2 is smaller than 50 μm, degaussing efficiency may decrease.

The plurality of first openings 140*h* formed in the first dummy pattern 140*a* may be filled with an additionally laminated insulating layer. For example, a second insulating layer 120 is disposed on the upper surface of the first insulating layer 110. Accordingly, the plurality of first openings 140*h* formed in the first dummy pattern 140*a* may be filled with the second insulating layer 120 disposed on the first insulating layer 110.

Meanwhile, instead of forming a plurality of first openings as in the present embodiment, a plurality of first dummy patterns spaced apart from each other are formed on the first region R1, and a separation space between the plurality of first dummy patterns may be used as the degassing hole. However, in the case of a structure of the comparative example, the plurality of first dummy patterns are physically separated from each other, and as a result, the warpage property of the circuit board in the region where the dummy pattern is disposed and other regions appear different from each other.

Unlike this, the embodiment may solve the problem of the comparative example by forming a plurality of first openings 140*h* spaced apart from each other on the first dummy pattern 140*a* as described above, thereby improving the reliability of the circuit board.

Meanwhile, a second dummy pattern 150*a* may be formed on a lower surface of the first insulating layer 110. In addition, the second dummy pattern 150*a* may include a plurality of second openings 150*h* spaced apart from each other. The plurality of second openings 150*h* may vertically overlap the lower surface of the first insulating layer 110.

The plurality of second openings 150*h* may be formed passing through upper and lower surfaces of the second dummy pattern 150*a*. The plurality of second openings 150*h* may have a structure substantially corresponding to the first opening 140*h* of the first dummy pattern 140*a*. That is, the second dummy pattern 150*a* may include a plurality of second openings 150*h* having a dot shape. Accordingly, the lower surface of the first insulating layer 110 vertically overlapping the plurality of second openings 150*h* may not contact the second dummy pattern 150*a* in the state in which the second dummy pattern 150*a* is formed. Gas remaining in the first insulating layer 110 may be degassed through the second opening 150*h*. Accordingly, the embodiment can improve reliability by relieving thermal stress by degassing the gas remaining in the first insulating layer 110.

Meanwhile, a third dummy pattern 160*a* may be formed on an upper surface of the second insulating layer 120. In addition, the third dummy pattern 160*a* may include a plurality of third openings 160*h* spaced apart from each other. The plurality of third openings 160*h* may vertically overlap an upper surface of the second insulating layer 120. That is, the plurality of third openings 160*h* may be formed passing through the upper and lower surfaces of the third dummy pattern 160*a*. The third dummy pattern 160*a* may include a plurality of third openings 160*h* having a dot shape. Accordingly, the upper surface of the second insulating layer 120 vertically overlapping the plurality of third openings 160*h* may not contact the third dummy pattern 160*a* in the state in which the third dummy pattern 160*a* is formed. In addition, gas remaining in the second insulating layer 110 may be degassed through the third opening 160*h*. Accordingly, the embodiment can improve reliability by relieving thermal stress by degassing the gas remaining in the second insulating layer 120.

Meanwhile, a fourth dummy pattern 170*a* may be formed on the lower surface of the third insulating layer 130. In addition, the fourth dummy pattern 170*a* may include a plurality of fourth openings 170*h* spaced apart from each other. The plurality of fourth openings 170*h* may vertically overlap the lower surface of the third insulating layer 130. The plurality of fourth openings 170*h* may be formed passing through upper and lower surfaces of the fourth dummy pattern 170*a*. For example, the fourth dummy pattern 170*a* may include a plurality of fourth openings 170*h* having a dot shape. Accordingly, the lower surface of the third insulating layer 130 vertically overlapping the plurality of fourth openings 170*h* may not contact the fourth dummy pattern 170*a* in the state in which the fourth dummy pattern 170*a* is formed. Gas remaining in the third insulating layer 130 may be degassed through the fourth opening 170*h*. Accordingly, the embodiment can improve reliability by relieving thermal stress by degassing the gas remaining in the third insulating layer 130.

Meanwhile, the plurality of third openings 160*h* formed in the third dummy pattern 160*a* may be filled with an insulating layer additionally laminated on the second insulating layer 120, but is not limited thereto. For example, when the second insulating layer 120 is an outermost insulating layer disposed on an uppermost side of the circuit board, the third opening 160*h* may be filled with a protective layer. For example, when the second insulating layer 120 is the outermost insulating layer disposed on the uppermost side of the circuit board, the third opening 160*h* may be filled with a solder resist layer (not shown), which is an example of a protective layer disposed on the second insulating layer 120.

Similarly, the plurality of fourth openings 170*h* formed in the fourth dummy pattern 170*a* may be filled with an insulating layer additionally laminated under the third insulating layer 130, but is not limited thereto. For example, when the third insulating layer 130 is an outermost insulating layer disposed on a lowermost side of the circuit board, the fourth opening 170*h* may be filled with a protective layer.

As described above, in the embodiment, a dummy pattern is formed in the first region R1 corresponding to the dummy region of the insulating layer, and a plurality of dot-shaped openings are formed in the dummy pattern. And, the plurality of openings allow gas remaining in the insulating layer to be degassed. Accordingly, the embodiment can improve the reliability of the circuit board by removing gas between the insulating layer and the circuit pattern layer. For example, the embodiment can minimize thermal stress of the insulating layer by removing gas remaining in the insulating layer. For example, the embodiment can solve a reliability problem in which the circuit pattern layer is detached from the insulating layer by removing the gas remaining in the insulating layer. In addition, the embodiment allows a plurality of openings to be included in the dummy pattern as described above, and accordingly, plating deviation of the circuit pattern layer can be improved by adjusting an area of the dummy pattern.

FIG. 4 is a modified example of a shape of an opening formed in a dummy pattern according to an embodiment.

First, referring to FIG. 3, a plurality of first openings 140*h* having circular planes may be formed in the first dummy pattern 140*a*.

Meanwhile, the shape of the first opening 140*h* formed in the first dummy pattern 140*a* may have a shape other than circular.

For example, as shown in (a) of FIG. 4, a plane of the first opening 140*h*-1 formed in the first dummy pattern 140*a* may have a rectangular shape.

For example, as shown in (b) of FIG. 4, a plane of the first opening 140*h*-2 formed in the first dummy pattern 140*a* may have a diamond shape.

However, the embodiment is not limited thereto, and the opening formed in the dummy pattern may be changed into various shapes such as a triangle, an ellipse, a heart, a star, and a fan shape.

Hereinafter, a method of manufacturing a circuit board according to the first embodiment shown in FIG. 1 will be described.

FIGS. 5 to 9 are views illustrating a method of manufacturing a circuit board illustrated in FIG. 1 in order of process.

Referring to FIG. 5, in the embodiment, a first insulating layer 110, which is a basis for manufacturing a circuit board, is prepared. In this case, the first insulating layer 110 may have a cured state at a first curing temperature. For example, the first curing temperature of the first insulating layer 110 may be 200° C. or more. Preferably, the first curing temperature may have a range between 200° C. and 250° C. The first curing temperature may be used as an important condition for determining a curing temperature of an additional insulating layer in a subsequent lamination process of the additional insulating layer. That is, the curing process after the additional insulating layer is laminated may be performed based on the first curing temperature that was performed during a lamination process of the first insulating layer.

Next, referring to FIG. 6, the embodiment may proceed with a process of forming a first circuit pattern layer on the upper surface of the first insulating layer 110, a process of forming a second circuit pattern layer on the lower surface of the first insulating layer 110, and a process of forming the first via V1 in the first insulating layer 110. Each of the first circuit pattern layer and the second circuit pattern layer may include a chemical copper plating layer formed through electroless plating and an electrolytic plating layer formed by plating the chemical copper plating layer as a seed layer.

In this case, each of the first circuit pattern layer and the second circuit pattern layer may be formed in the first region R1 and the second region R2 of the first insulating layer 110, respectively. For example, the first circuit pattern layer may include a first dummy pattern 140*a* formed in the first region R1 of the first insulating layer 110 and a first effective pattern 140*b* formed in the second region R2. For example, the second circuit pattern layer may include a second dummy pattern 150*a* formed in the first region R1 of the first insulating layer 110 and a second effective pattern 150*b* formed in the second region R2.

Meanwhile, the first dummy pattern 140*a* may be formed to entirely cover the upper surface of the first region R1 of the first insulating layer 110. In addition, the second dummy pattern 150*a* may be formed to entirely cover the lower surface of the first region R1 of the first insulating layer 110.

Next, referring to FIG. 7, the embodiment may proceed with a process of forming a plurality of first openings 140*h* spaced apart from each other in the first dummy pattern 140*a*. In addition, the embodiment may proceed with a process of forming a plurality of second openings 150*h* spaced apart from each other in the second dummy pattern 150*a*. Each of the first opening 140*h* and the second opening 150*h* may have a first diameter D1 and be spaced apart from each other by a first distance D2. Each of the plurality of first openings 140*h* and second openings 150*h* may have a dot shape.

Next, referring to FIG. 8, the embodiment may proceed with a process of forming the second insulating layer 120 on the upper surface of the first insulating layer 110 and a process of forming the third insulating layer 130 on the lower surface of the first insulating layer 110.

In this case, the embodiment may proceed with a process of curing the second insulating layer 120 or the third insulating layer 130 at a second curing temperature after the second insulating layer 120 or the third insulating layer 130 is laminated on the first insulating layer 110.

The second curing temperature may be different from the first curing temperature applied to the first insulating layer 110. For example, the second curing temperature may be greater than the first curing temperature. In other words, a curing degree of the second insulating layer 120 or the third insulating layer 130 may be greater than that of the first insulating layer 110. For example, a curing process of the second insulating layer 120 or the third insulating layer 130 may be performed at a higher curing temperature than that of the first insulating layer 110. The second curing temperature may be 205° C. or more. Preferably, the second curing temperature may have a range between 205° C. and 270° C. That is, the second curing temperature may be set higher than the first curing temperature within a range of 205° C. to 270° C. Accordingly, the embodiment can minimize the stress of the first insulating layer 110 in the curing process of the second insulating layer 120 or the third insulating layer 130 and accordingly, the warpage property of the circuit board may be improved.

Meanwhile, the plurality of first openings 140*h* formed in the first dummy pattern 140*a* may be filled with the second insulating layer 120. In addition, the plurality of second openings 150*h* formed in the second dummy pattern 150*a* may be filled with the third insulating layer 130.

In addition, the embodiment may proceed with a process of forming a third circuit pattern layer on the upper surface of the second insulating layer 120 and a process of forming a fourth circuit pattern layer on the lower surface of the third insulating layer 130. In addition, the embodiment may proceed with a process of forming the second via V2 in the second insulating layer 120 and a process of forming the third via V3 in the third insulating layer 130.

In this case, each of the third circuit pattern layer and the fourth circuit pattern layer may be formed in the first region R1 and the second region R2 of the second insulating layer 120 and the third insulating layer 130, respectively. For example, the third circuit pattern layer may include a third dummy pattern 160*a* formed in the first region R1 of the second insulating layer 120 and a third effective pattern 160*b* formed in the second region R2. For example, the fourth circuit pattern layer may include a fourth dummy pattern 170*a* formed in the first region R1 and a fourth effective pattern 170*b* formed in the second region R2 of the third insulating layer 130.

Meanwhile, the third dummy pattern 160*a* may be formed to entirely cover the upper surface of the first region R1 of the second insulating layer 120. In addition, the fourth dummy pattern 170*a* may be formed to entirely cover the lower surface of the first region R1 of the third insulating layer 130.

Next, referring to FIG. 9, the embodiment may proceed with a process of forming a plurality of third openings 160*h* spaced apart from each other in the third dummy pattern 160*a*. In addition, the embodiment may proceed with a process of forming a plurality of fourth openings 170*h* spaced apart from each other in the fourth dummy pattern 170*a*. The third opening 160*h* and the fourth opening 170*h* may have a first diameter D1 and be spaced apart from each other by a first distance D2. Each of the plurality of third openings 160*h* and fourth openings 170*h* may have a dot shape.

In addition, the embodiment may proceed with a process of additionally laminating a fourth insulating layer (not shown) on the second insulating layer 120. In this case, when the fourth insulating layer is additionally laminated, the fourth insulating layer may be cured at a third curing temperature. The third curing temperature may be different from the first curing temperature applied to the first insulating layer 110 and the second curing temperature applied to the second insulating layer 120. For example, the third curing temperature may be higher than the first curing temperature and the second curing temperature. In other words, the degree of curing of the fourth insulating layer may be greater than the degree of curing of the second insulating layer 120 and the degree of curing of the first insulating layer 110. For example, a process of curing the fourth insulating layer may be performed at a curing temperature higher than the curing temperature of the first insulating layer 110 and the curing temperature of the second insulating layer 120. The third curing temperature may be 220° C. or more. Preferably, the third curing temperature may have a range between 220° C. and 300° C. That is, the third curing temperature may be set higher than the first and second curing temperatures within a range of 220° C. to 300° C. Accordingly, the embodiment may minimize stress of the first insulating layer 110 and the second insulating layer 120 during the curing process of the fourth insulating layer, thereby improving the warpage property.

As described above, the first embodiment forms a plurality of openings spaced apart from each other in one dummy pattern, and, thereby, the gas remaining in the insulating layer may be removed while maintaining the warpage property of the circuit board.

FIG. 10 is a view illustrating a circuit board according to a second embodiment.

Referring to FIG. 10, the circuit board according to the second embodiment includes a first insulating layer 210, a second insulating layer 220, a third insulating layer 230, and circuit pattern layers 240*a*, 240*b*, 250*a*, 250*b*, 260*a*, 260*b*, 270*a* and 270*b* and vias V1, V2, V3.

Here, before explaining FIG. 10, it will omit descriptions of substantially the same configuration as the circuit board of the first embodiment shown in FIG. 1.

The opening for degassing in the first embodiment of FIG. 1 has a structure formed only in the dummy pattern. Alternatively, as shown in FIG. 10, openings for degassing may be formed not only in the dummy pattern but also in the insulating layer vertically overlapping the dummy pattern.

Accordingly, the opening for degassing according to the second embodiment as shown in FIG. 10 may be divided into a first portion formed in a dummy pattern and a second portion formed in the insulating layer.

Specifically, a first circuit pattern layer may include a first dummy pattern 240*a* disposed in a first region R1 of an upper surface of a first insulating layer 210 and a second effective pattern 250*b* disposed in a second region R2.

In addition, a second circuit pattern layer may include a second dummy pattern 250*a* disposed in the first region R1 of a lower surface of the first insulating layer 210 and a second effective pattern 250*b* disposed in the second region R2.

In addition, the third circuit pattern layer may include a third dummy pattern 260*a* disposed in the first region R1 of the upper surface of the second insulating layer 220 and a third effective pattern 260*b* disposed in the second region R2.

In addition, the fourth circuit pattern layer may include a fourth dummy pattern 270*a* disposed in the first region R1 of the lower surface of the third insulating layer 230 and a fourth effective pattern 270*b* disposed in the second region R2.

Specifically, a first opening 240*h* may be formed in the first insulating layer 210 and the first dummy pattern 240*a*. For example, the first opening 240*h* may include a first-first portion 240*h*-1 formed passing through the upper and lower surfaces of the first dummy pattern 240*a*. The first-first portion 240*h*-1 of the first opening 240*h* may be substantially the same as the first opening 140*h* described with reference to FIGS. 1 and 3. In addition, the first opening 240*h* may include a first-second portion 240*h*-2 connected to the first-first portion 240*h*-1 and formed in the first insulating layer 210. The first-second portion 240*h*-2 formed in the first insulating layer 210 may have a structure that passes through the first insulating layer 210, or may have a structure that does not pass through the first insulating layer 210. As described above, the embodiment allows the first opening 240*h* for degassing to have a structure including the first-first portion 240*h*-1 formed in the first dummy pattern 240*a* and the second-second portion 240*h*-2 formed in the first insulating layer 210. Accordingly, the embodiment can completely remove even the gas penetrating into the first insulating layer 210, thereby improving reliability. That is, when the first opening 240*h* includes only the first-first portion 240*h*-1 as in the first embodiment, the gas in the first insulating layer 210 may not be completely removed. Accordingly, the second embodiment allows a first-second portion 240*h*-2 connected to the first-first portion 240*h*-1 of the first opening 240*h* to be additionally formed in the first insulating layer 210. In addition, the second embodiment allows the gas in the first insulating layer 210 to be removed through the first-second portion 240*h*-2 of the first opening 240*h*, and accordingly, the reliability of the circuit board can be further improved.

Correspondingly, a second opening 250*h* may be formed in the first insulating layer 210 and the second dummy pattern 250*a*. For example, the second opening 250*h* may include a second-first portion 250*h*-1 formed passing through the upper and lower surfaces of the second dummy pattern 250*a*. The second-first portion 250*h*-1 of the second opening 250*h* may be substantially the same as the second opening 150*h* described with reference to FIGS. 1 and 3. In addition, the second opening 250*h* may include a second-second portion 250*h*-2 connected to the second-first portion 250*h*-1 and formed in the first insulating layer 210. The second-second portion 250*h*-2 formed in the first insulating layer 210 may have a structure that passes through the first insulating layer 210, or may have a structure that does not pass through the first insulating layer 210. That is, the second opening 250*h* in the second embodiment has a structure including the second-first portion 250*h*-1 formed in the second dummy pattern 250*a* and a second-second portion 250*h*-2 formed in the first insulating layer 210. Accordingly, the embodiment can completely remove even the gas penetrating into the first insulating layer 210, thereby improving reliability.

In addition, a third opening 260*h* may be formed in the second insulating layer 220 and the third dummy pattern 260*a*. For example, the third opening 260*h* may include a third-first portion 260*h*-1 passing through the upper and lower surfaces of the third dummy pattern 260*a*. The third-first portion 260*h*-1 of the third opening 260*h* may be substantially the same as the third opening 160*h* described with reference to FIGS. 1 and 3. In addition, the third opening 260*h* may include a third-second portion 260*h*-2 connected to the third-first portion 260*h*-1 and formed in the second insulating layer 220. The third-second portion 260*h*-2 formed in the second insulating layer 220 may have a structure that passes through the second insulating layer 220, or may have a structure that does not pass through the second insulating layer 220.

In addition, a fourth opening 270*h* may be formed in the third insulating layer 230 and the fourth dummy pattern 270*a*. For example, the fourth opening 270*h* may include a fourth-first portion 270*h*-1 formed passing through the upper and lower surfaces of the fourth dummy pattern 270*a*. The fourth-first portion 270*h*-1 of the fourth opening 270*h* may be substantially the same as the fourth opening 170*h* described with reference to FIGS. 1 and 3. In addition, the fourth opening 270*h* may include a fourth-second portion 270*h*-2 connected to the fourth-first portion 270*h*-1 and formed in the third insulating layer 230. The fourth-second portion 270*h*-2 formed in the third insulating layer 230 may have a structure that passes through the third insulating layer 230, or may have a structure that does not pass through the third insulating layer 230. As described above, the embodiment allows the fourth opening 270*h* for degassing to have a structure including the fourth-first portion 270*h*-1 formed in the fourth dummy pattern 270*a* and the fourth-second portion 270*h*-2 formed in the third insulating layer 210. Accordingly, the embodiment can completely remove even the gas penetrating into the third insulating layer 230, thereby improving reliability.

Meanwhile, the opening as described above may be filled by a build-up insulating layer in a laminating process of the insulating layer. For example, the first-first portion 240*h*-1 and the first-second portion 240*h*-2 of the first opening 240*h* may be filled with the second insulating layer 220. For example, the second-first portion 250*h*-1 and the second-second portion 250*h*-2 of the second opening 250*h* may be filled with the third insulating layer 230.

Meanwhile, the third-first portion 260*h*-1 and the third-second portion 260*h*-2 of the third opening 260*h* may be filled with an additional build-up insulating layer, or may be filled with a solder resist layer, which is an example of a protective layer. Similarly, the fourth-first portion 270*h*-1 and the fourth-second portion 270-2 of the fourth opening 270*h* may be filled with an additional build-up insulating layer, or may be filled with a solder resist layer, which is an example of a protective layer.

Hereinafter, A process for manufacturing the circuit board according to the second embodiment shown in FIG. 10 will be described.

FIGS. 11 to 14 are views illustrating a method of manufacturing a circuit board illustrated in FIG. 10 in order of process.

Referring to FIG. 11, in the embodiment, a first insulating layer 210, which is a basis for manufacturing a circuit board, is prepared.

In addition, the embodiment may proceed with a process of forming a first circuit pattern layer on the upper surface of the first insulating layer 210, a process of forming a second circuit pattern layer on the lower surface of the first insulating layer 210 and a process of forming the first via V1 in the first insulating layer 210. Each of the first circuit pattern layer and the second circuit pattern layer may include a chemical copper plating layer formed through electroless plating and an electrolytic plating layer formed by plating the chemical copper plating layer as a seed layer.

In this case, each of the first circuit pattern layer and the second circuit pattern layer may be formed in the first region R1 and the second region R2 of the first insulating layer 210, respectively. For example, the first circuit pattern layer may include a first dummy pattern 240*a* formed in the first region R1 of the first insulating layer 210 and a first effective pattern 240*b* formed in the second region R2. For example, the second circuit pattern layer may include a second dummy pattern 250*a* formed in the first region R1 of the first insulating layer 210 and a second effective pattern 250*b* formed in the second region R2.

Meanwhile, the first dummy pattern 240*a* may partially or entirely cover the upper surface of the first region R1 of the first insulating layer 210. In addition, the second dummy pattern 250*a* may partially or entirely cover the lower surface of the first region R1 of the first insulating layer 210.

Next, referring to FIG. 12, the embodiment may proceed with a process of forming the first opening 240*h* and the second opening 250*h*.

For example, in the embodiment, a first-first portion 240*h*-1 of the first opening 240*h* is formed in the first dummy pattern 240*a* and a first-second portion 240*h*-2 of the first opening 240*h* may be formed in the first insulating layer 210 to be connected to the first-first portion 240*h*-1.

In addition, in the embodiment, a second-first portion 250*h*-1 of the second opening 250*h* is formed in the second dummy pattern 250*a*, and the second-second portion 250*h*-2 of the second opening 250*h* may be formed in the first insulating layer 210 to be connected to the second-first portion 250*h*-1.

Meanwhile, the portion formed in the first insulating layer 210 among the first opening 240*h* and the second opening 250*h* is divided into a plurality of portions, but is not limited thereto. For example, the first-second portion 240*h*-2 of the first opening 240*h* may include the second-second portion 250*h*-2 of the second opening 250*h* shown in the drawing. That is, the first-second portion 240*h*-2 and the second-second portion 250*h*-2 may be integrally formed as one portion.

Next, referring to FIG. 13, the embodiment may proceed with a process of forming the second insulating layer 220 on the upper surface of the first insulating layer 210 and a process of forming the third insulating layer 230 on the lower surface of the first insulating layer 210.

In this case, the first opening 240*h* formed in the first dummy pattern 240*a* and the first insulating layer 210 may be filled with the laminated second insulating layer 220.

In addition, the plurality of second openings 250*h* formed in the second dummy pattern 250*a* and the first insulating layer 210 may be filled with the laminated third insulating layer 230.

In addition, the embodiment may proceed with a process of forming a third circuit pattern layer on the upper surface of the second insulating layer 220 and forming a fourth circuit pattern layer on the lower surface of the third insulating layer 230. In addition, the embodiment may proceed with a process of forming the second via V2 in the second insulating layer 220 and forming the third via V3 in the third insulating layer 230. Each of the third circuit pattern layer and the fourth circuit pattern layer may include a chemical copper plating layer formed through electroless plating and an electrolytic plating layer formed by plating the chemical copper plating layer as a seed layer.

In this case, each of the third circuit pattern layer and the fourth circuit pattern layer may be formed in the first region R1 and the second region R2 of the second insulating layer 220 and the third insulating layer 230, respectively. For example, the third circuit pattern layer may include a third dummy pattern 260*a* formed in the first region R1 of the second insulating layer 220 and a third effective pattern 260*b* formed in the second region R2. For example, the fourth circuit pattern layer may include a fourth dummy pattern 270*a* formed in the first region R1 of the third insulating layer 230 and a fourth effective pattern 270*b* formed in the second region R2. Meanwhile, the formed third dummy pattern 260*a* may be formed to entirely cover the upper surface of the first region R1 of the second insulating layer 220. In addition, the fourth dummy pattern 270*a* may be formed to entirely cover the lower surface of the first region R1 of the third insulating layer 230.

Next, referring to FIG. 14, the embodiment may proceed with a process of forming a plurality of third openings 260*h* spaced apart from each other in the third dummy pattern 260*a* and the second insulating layer 220. In addition, the embodiment may proceed with a process of forming a plurality of fourth openings 270*h* spaced apart from each other in the fourth dummy pattern 270*a* and the third insulating layer 230.

That is, the third opening 260*h* may include a third-first portion 260*h*-1 formed passing through the upper and lower surfaces of the third dummy pattern 260*a* and a third-second portion 260*h*-2 connected to the third-first portion 260*h*-1 and formed in the second insulating layer 220.

In addition, the fourth opening 270*h* may include a fourth-first portion 270*h*-1 formed passing through the upper and lower surfaces of the fourth dummy pattern 270*a* and a fourth-second portion 270*h*-2 connected to the fourth-first portion 270*h*-1 and formed in the third insulating layer 230.

Meanwhile, it is not described in the manufacturing process of the second embodiment above. However, curing temperatures for the first insulating layer 210, the second insulating layer 220, and the third insulating layer 230 may be different from each other. For example, the curing temperature may increase as the laminate is relatively late based on the manufacturing process.

Meanwhile, the circuit board of the embodiment may be manufactured using an embedded trace substrate (ETS) method. Here, the circuit board manufactured by the ETS method has a structure in which an outermost circuit pattern layer is embedded in the insulating layer. For example, in the embodiment, a plurality of circuit boards may be simultaneously manufactured on both sides of a carrier board.

A circuit board manufactured in the following manufacturing process may include the dummy pattern and the opening of the circuit board of FIG. 1 or FIG. 10. However, hereinafter, the effective pattern formed in the second region of the circuit board will be mainly described for convenience of description. The embodiment may improve the warpage property of the circuit board by applying different curing temperatures of the insulating layers during manufacture of the circuit board. However, in the following description, a dummy pattern and an opening corresponding to FIG. 1 or FIG. 10 may be formed in the second region of the circuit board.

FIGS. 15 to 21 are views illustrating a method of manufacturing a circuit board according to a third embodiment in order of process, and FIG. 22 is a view illustrating shrinkage properties in an assembly process in the third embodiment and the comparative example.

First, in a third embodiment, a plurality of circuit boards may be simultaneously manufactured on both sides of a carrier board using the carrier board. That is, the embodiment proceeds with a process of manufacturing the substrate by applying the ETS method at each of the both sides of the carrier board, so that a plurality of substrates can be simultaneously manufactured.

Referring to FIG. 15, in the embodiment, a carrier board 410 is prepared.

The carrier board 410 may have a structure in which an insulating member 411 and a metal layer 412 are disposed on both surfaces of the insulating member 411.

When the carrier board 410 is prepared, a process of forming a plating layer 420 on the metal layer 412 of the carrier board 410 may be performed. The plating layer 420 may be a seed layer for forming the first circuit pattern layer 340 by electroplating according to the embodiment. The plating layer 420 may be a chemical copper plating layer by electroless plating, but is not limited thereto.

Next, the embodiment may proceed with a process of forming the first circuit pattern layer 340 on the plating layer 420.

The first circuit pattern layer 340 may be formed by the following process.

When the plating layer 420 is formed, the embodiment may proceed with a process of forming a mask (not shown) for forming the first circuit pattern layer 340 on the plating layer 420. In addition, a process of forming an opening (not shown) vertically overlapping a region of the plating layer 420 on which the first circuit pattern layer 340 is to be formed may be performed by proceeding with the exposure and development process of the mask. In addition, when an opening is formed in the mask, the embodiment may proceed with a process of electroplating the plating layer 420 as a seed layer and a process of forming the first circuit pattern layer 340 filling the opening of the mask.

In this case, it is not illustrated in the drawing, but the first circuit pattern layer 340 may include a first dummy pattern disposed in the first region and a first effective pattern disposed in the second region.

Next, referring to FIG. 16, a first insulating layer 310 covering the first circuit pattern layer 340 is formed on the plating layer 420.

Meanwhile, when the first insulating layer 310 is laminated, a curing process may be performed to cure the laminated first insulating layer 310. In this case, the first insulating layer 310 may proceed within a first curing temperature. For example, the first curing temperature may be 200° C. or more. Preferably, the first curing temperature may have a range between 200° C. and 250° C.

The first curing temperature may be used as an important condition for determining the curing temperature of the additional insulating layer in a subsequent lamination process of the additional insulating layer. That is, the curing process after the additional insulating layer is laminated may be performed based on the first curing temperature that was performed during the previous lamination process of the first insulating layer.

Next, referring to FIG. 17, the embodiment may proceed with a process of forming a first via V1 in the first insulating layer 310. The first via V1 may be formed by filling an inside of a through hole passing through the first insulating layer 310 with a metal material. In addition, the embodiment may proceed with a process of forming the second circuit pattern layer 350 on the first insulating layer 310 during the process of forming the first via V1. The second circuit pattern layer 350 may include a second dummy pattern and a second effective pattern. An opening corresponding to the degassing hole may be formed in at least one of the second dummy pattern and the first insulating layer 310.

Next, referring to FIG. 18, in an embodiment, a lamination process that additionally proceeds with the processes of FIGS. 16 and 17 may be performed.

That is, the embodiment may proceed with a process of laminating the second insulating layer 320 covering the second circuit pattern layer 350 on the first insulating layer 310. After the second insulating layer 320 is laminated, a curing process may be performed to cure the laminated second insulating layer 320. The second insulating layer 320 may be processed within a second curing temperature. The second curing temperature may be different from the first curing temperature performed on the first insulating layer 310. For example, the second curing temperature may be greater than the first curing temperature. In other words, the curing degree of the second insulating layer 320 may be greater than that of the first insulating layer 310. For example, the curing process of the second insulating layer 320 may be performed at a higher curing temperature than that of the first insulating layer 310. The second curing temperature may be 205° C. or more. Preferably, the second curing temperature may have a range between 205° C. and 270° C. That is, the second curing temperature may be set higher than the first curing temperature within a range of 205° C. to 270° C. Accordingly, in the embodiment, stress of the first insulating layer 310 can be minimized in the curing process of the second insulating layer 320, and accordingly, warpage property can be improved.

In addition, when the second insulating layer 320 is laminated, the embodiment may proceed with a process of forming the second via V2 and the third circuit pattern layer 360 in the second insulating layer 320. In addition, the third circuit pattern layer 360 may include a third dummy pattern and a third effective pattern.

Next, referring to FIG. 19, a lamination process that additionally proceeds with the processes of FIGS. 16 and 17 may be performed.

That is, the embodiment may proceed with a process of laminating the third insulating layer 330 covering the third circuit pattern layer 360 on the second insulating layer 320. After the third insulating layer 330 is laminated, a curing process may be performed to cure the laminated third insulating layer 330. The third insulating layer 330 may be processed within a third curing temperature. The third curing temperature may be different from the first curing temperature of the first insulating layer 310 and the second curing temperature of the second insulating layer 320. For example, the third curing temperature may be higher than each of the first curing temperature and the second curing temperature. In other words, the curing degree of the third insulating layer 330 may be greater than the curing degree of the second insulating layer 320 and the curing degree of the first insulating layer 310. For example, the curing process of the third insulating layer 330 and the curing process of the first insulating layer 310 may be performed at a higher curing temperature than the curing temperature of each of the second insulating layers 320. The third curing temperature may be 220° C. or more. Preferably, the third curing temperature may have a range between 220° C. and 300° C. That is, the third curing temperature may be set higher than each of the first and second curing temperatures within a range of 220° C. to 300° C. Accordingly, in the embodiment, the stress of the first insulating layer 310 and the second insulating layer 320 can be minimized in the curing process of the third insulating layer 330, and accordingly, warpage property can be improved.

In addition, when the third insulating layer 330 is laminated, the embodiment may proceed with a process of forming the third via V3 and the fourth circuit pattern layer 370 in the third insulating layer 330. The fourth circuit pattern layer 370 may include a fourth dummy pattern and a fourth effective pattern.

As described above, in the embodiment, a circuit board is manufactured by sequentially laminating a plurality of insulating layers around the carrier board 410 through the ETS process. In this case, the embodiment applies a different curing temperature to each insulating layer in a laminating process of the plurality of insulating layers. For example, a curing temperature may be increased stepwise in an order of lamination. For example, in the embodiment, the curing temperature of an insulating layer laminated first among the plurality of insulating layers is the lowest compared to a curing temperature of the other insulating layers. In addition, in the embodiment, a curing temperature of an insulating layer laminated last among the plurality of insulating layers is the highest compared to a curing temperature of the other insulating layers. Accordingly, the embodiment can improve a warpage property through balance optimization of a laminated curing degree of each insulating layer of a multi-layer substrate.

In addition, the embodiment performs a process of manufacturing a circuit board on each of both sides of the carrier board 410 as described above. In this case, the curing temperatures of the insulating layers symmetrical to each other with respect to the carrier board 410 may be the same.

For example, in an embodiment, the curing temperature of the first insulating layer laminated on an upper part of the carrier board 410 may be the same as the curing temperature of the first insulating layer 310 laminated on the lower part of the carrier board 410. For example, in an embodiment, the curing temperature of the second insulating layer laminated on the upper part of the carrier board 410 may be the same as the curing temperature of the second insulating layer laminated on the lower part of the carrier board 410. For example, in an embodiment, the curing temperature of the third insulating layer laminated on the upper part of the carrier board 410 may be the same as the curing temperature of the third insulating layer laminated on the lower part of the carrier board 410.

Next, referring to FIG. 20, when the process of laminating the insulating layer and the process of forming the circuit pattern are completed on both sides of the carrier board 410 as described above, the embodiment may proceed with a process of removing the carrier board 410. Specifically, the embodiment may proceed with a process of separating two circuit boards disposed on both sides of the carrier board 410 from each other. In addition, when the circuit board is completely separated as the carrier board 410 is removed, the embodiment may proceed with a baking process. The baking process may be performed at a temperature lower than the curing temperature of each insulating layer constituting the circuit board. That is, when the baking process proceeds to a temperature corresponding to the curing temperature of the insulating layer, additional stress may be applied to the plurality of insulating layers included in the circuit board. Accordingly, the embodiment may proceed with the process of baking the separated circuit board at a temperature lower than the curing temperature applied to a plurality of insulating layers included in the circuit board. For example, the temperature of the baking process may be 150° C. or more. For example, the temperature of the baking process may be less than 200° C. That is, the temperature of the baking process may satisfy a range between 150° C. and 200° C. For example, the temperature of the baking process may satisfy a range between 160° C. and 190° C. In addition, when the baking process proceeds, shrinkage in a reflow process additionally performed on the separated circuit board may be minimized. That is, the circuit board can be used as a package board, and accordingly, a process of reflowing a solder is performed after disposing the solder (not shown) on an outermost circuit pattern layer in an assembly process. In this case, shrinkage of the circuit board may occur in the reflow process, and thus, there is a problem in that warpage property of the circuit board is deteriorated. In contrast, in the embodiment, a baking process is performed on the separated circuit board. In addition, the degree of shrinkage of the circuit board generated in the reflow process can be minimized by the baking process, and thus a reliability problem of the circuit board can be solved.

Next, the embodiment may proceed with a process of removing the plating layer 420 disposed on the lower surface of the first insulating layer 310. The plating layer 420 may be removed through a flash etching process.

Next, referring to FIG. 21, the embodiment may proceed with a process of forming the first protective layer 380 on the lower surface of the first insulating layer 310 and a process of forming the second protective layer 390 on the upper surface of the third insulating layer 330.

Referring to FIG. 22, in an embodiment, a shrinkage problem occurring in an assembly process of the circuit board may be improved as the baking process proceeds.

FIG. 22 (*a*) is a view showing shrinkage properties of a circuit board according to a comparative example, and FIG. 22 (*b*) is a view showing shrinkage properties of a circuit board according to an embodiment.

And, comparing (a) and (b) of FIG. 22, as the baking process according to the embodiment progressed, it was confirmed that the shrinkage properties in the package assembly process decreased from (+) μm to 0 μm, and from 0 μm to (−) μm. Accordingly, the embodiment may improve the shrinkage deviation at room temperature occurring in the assembly process of the circuit board and may improve reliability.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

The invention claimed is:

1. A circuit board comprising:

a first insulating layer;

a first circuit pattern layer disposed on the first insulating layer; and a second insulating layer disposed on the first insulating layer and the first circuit pattern layer, wherein the first insulating layer includes a first opening passing through at least a part of the first insulating layer from an upper surface of the first insulating layer toward a lower surface of the first insulating layer, wherein the first circuit pattern layer includes a first electrode having a second opening overlapping the first opening in a vertical direction, wherein the second opening passes through upper and lower surfaces of the first electrode, wherein the second insulating layer is provided to fill the first opening of the first insulating layer and the second opening of the first electrode, and wherein a width of the first opening in a region closest to the second opening is the same as a width of the second opening in a region closest to the first opening.

2. The circuit board of claim 1, wherein the first opening passes through the upper and lower surfaces of the first insulating layer.

3. The circuit board of claim 2, wherein the first opening includes:

a first sidewall adjacent to the upper surface of the first insulating layer and having a first slope having a width gradually decreasing toward the lower surface of the first insulating layer; and a second sidewall adjacent to the lower surface of the first insulating layer and having a second slope having a width gradually decreasing toward the upper surface of the first insulating layer.

4. The circuit board of claim 3, wherein the second insulating layer includes:

a first portion disposed on the first insulating layer; and a second portion protruding downward from the first portion and disposed in the first opening, and wherein the second portion of the second insulating layer includes the first slope and the second slope.

5. The circuit board of claim 3, wherein the first insulating layer further includes a first through hole spaced apart from the first opening in a horizontal direction.

6. The circuit board of claim 5, further comprising:

a via electrode disposed in the first through hole, wherein the first circuit pattern layer is connected to the via electrode.

7. The circuit board of claim 6, wherein the via electrode includes:

a first overlapping portion overlapping the first sidewall in a horizontal direction; and a second overlapping portion overlapping the second sidewall in the horizontal direction, wherein the first overlapping portion is inclined in the same direction as a direction in which the first sidewall is inclined, and wherein the second overlapping portion is inclined in a direction different from a direction in which the second sidewall is inclined.

8. The circuit board of claim 6, wherein the via electrode has an inclination in which a width gradually decreases from an upper surface of the via electrode to a lower surface of the via electrode.

9. The circuit board of claim 6, wherein a plurality of second openings are provided to be spaced apart from each other in the first electrode.

10. The circuit board of claim 9, wherein the plurality of second openings have a diameter ranging from 100 μm to 300 μm.

11. The circuit board of claim 9, wherein a distance between second openings adjacent to each other among the plurality of second openings is in a range of 25 μm to 50 μm.

12. The circuit board of claim 6, wherein the second insulating layer includes a third opening overlapping the second opening in a vertical direction and passing through at least a part of the second insulating layer from an upper surface of the second insulating layer toward a lower surface of the second insulating layer.

13. The circuit board of claim 12, further comprising:

a third insulating layer disposed on the second insulating layer, wherein the third insulating layer is provided to fill the third opening.

14. The circuit board of claim 12, further comprising:

a protective layer disposed on the second insulating layer, wherein the protective layer is provided to fill the third opening.

15. The circuit board of claim 13, wherein at least one of the first opening and the third opening is provided as a recess that does not pass through at least one of the first insulating layer and the third insulating layer.

16. The circuit board of claim 13, wherein the circuit board includes a dummy region, and wherein the first opening and the third opening are provided in the dummy region.

* * * * *